United States Patent [19]

Higgins

[11] Patent Number: 5,390,198
[45] Date of Patent: Feb. 14, 1995

[54] SOFT DECISION VITERBI DECODER FOR M-ARY CONVOLUTIONAL CODES

[75] Inventor: Robert P. Higgins, Seattle, Wash.

[73] Assignee: The Boeing Company, Seattle, Wash.

[21] Appl. No.: 67,669

[22] Filed: May 26, 1993

[51] Int. Cl.$^6$ ........................................... G06F 11/10
[52] U.S. Cl. ........................................... 371/43
[58] Field of Search ........................... 371/43, 37.1

[56] References Cited

U.S. PATENT DOCUMENTS

| 4,240,156 | 12/1980 | Doland | 371/43 |
|---|---|---|---|
| 4,346,473 | 8/1982 | Davis | 371/43 |
| 4,404,674 | 9/1983 | Rhodes | 371/43 |
| 4,536,878 | 8/1985 | Rattlingourd et al. | 371/43 |
| 4,837,766 | 6/1989 | Yoshida | 371/46 |
| 4,868,830 | 9/1989 | Pollara-Bozzola | 371/43 |
| 4,901,307 | 2/1990 | Gilhousen et al. | 370/18 |
| 4,922,507 | 5/1990 | Simon et al. | 375/26 |
| 5,095,484 | 3/1992 | Karabed et al. | 371/30 |
| 5,128,967 | 7/1992 | Durkin et al. | 375/83 |

OTHER PUBLICATIONS

B. Trumpis, "Convolutional Coding for M-ary Channels," Abstract of the Dissertation, *University of California*, 1975, pp. 1–102.
Unknown, "Convolutional Code Structure and Viterbi Decoding," Chapter 6, pp. 252–265.

*Primary Examiner*—Paul Gordon
*Attorney, Agent, or Firm*—Christensen, O'Connor, Johnson & Kindness

[57] ABSTRACT

An error control decoder (44) for use in decoding signals encoded with an M-ary convolutional code and a method for decoding such a code. The error control decoder includes a branch metrics module (46) that determines differences between the correlation values of each of eight possible symbols used to represent data encoded and the largest of these correlation values. An add-compare-select module (50) determines path metric values for each of 64 states by adding selected branch metric values to prior state metrics for the two possible paths that lead to a current state metric. The minimum path metric of the two is then assigned as a new state metric, and a logic level identifying the selected path metric is stored in a path history module (62). This procedure is repeated for each of the 64 states. A minimum state metric from the prior symbol period is determined and used to normalize the current state metrics to avoid overflow. After processing data for 36 symbol periods to form the initial path history, the data are decoded by tracing back through the path history to identify a state that most likely represents the binary data originally encoded. The error control decoder is disclosed in use in a spread spectrum communication system (20).

21 Claims, 15 Drawing Sheets

SOFT DECISION VITERBI DECODER FOR M-ARY CONVOLUTIONAL CODES

FIELD OF THE INVENTION

The present invention is generally directed to an error correction system used in a communication system employing convolutional codes, and more specifically, relates to an error correction decoder in a receiver of such a communication system.

BACKGROUND OF THE INVENTION

Radio transmissions in communication systems are often subject to noise or jamming that can cause significant errors in the received signal. One of the techniques commonly used to prevent loss of data from a signal transmitted over a noisy or fading channel uses a convolutional encoder to encode the signal input to the transmitter, producing an encoded binary signal. The encoded binary signal provides redundant information that enables correction of erroneous data caused by noise or other sources of signal degradation.

The method used for decoding a received signal has been shown to have a significant impact on the performance of the error correction codes employed in a communication system. It has been determined, for example, that soft decision decoding offers substantially improved performance over hard decision decoding, by reducing the amount of energy required to correctly transmit information. Techniques that implement maximum likelihood decoding provide further improved performance over other decoding techniques, increasing the efficiency of the error correction process.

A soft decision Viterbi decoder algorithm thus represents a preferred approach for decoding a convolutional encoded binary signal. The transmitted data are recovered with this type of decoder by applying a maximum likelihood sequence probability analysis to select the bit most likely transmitted. An example of a soft decision Viterbi decoder is disclosed in U.S. Pat. No. 4,536,878, issued on Aug. 20, 1985 to Rattlingourd et al. The decoder in this patent is implemented on a monolithic very large scale integrated (VLSD circuit that includes a branch metric calculator, a metric update circuit, a path update, a majority vote circuit, and a control circuit. The encoded binary data transmitted comprise symbol pairs, each symbol of the pair comprising three bits, including a sign bit, a most significant bit (MSB), and a least significant bit (LSB). The branch metric calculator determines a difference between the symbol pairs and each of the four possible symbol pair combinations (00, 01, 10, and 11), producing metrics $H_{00}$ through $H_{11}$, respectively. The metrics are supplied to the metric update circuit, which determines errors for each metric and accumulates these errors as measured, at each of 64 nodes. The metric update circuit determines the minimum error for the metric value of the measurement, which establishes a maximum probability path through a state trellis. This path is updated for each symbol pair received and processed, yielding an indication of the transmitted encoded binary signal and thus, an indication of each binary bit that was input for transmission.

Convolutional encoding of a transmitted signal is usable with many types of communication systems and is particularly applicable to a spread spectrum system. A spread spectrum communication system is sometimes used to insure a low probability of interception of transmitted signals by a third party. In this type of system, a transmitted signal is spread over a frequency band that is much wider than the bandwidth of the information being transmitted. This approach reduces the amount of energy required to communicate information to the lowest level possible, thereby increasing the difficulty of intercepting the signal. Because the transmission has insufficient signal energy for a receiver to acquire a phase lock, the communication system must inherently be non-coherent.

Since a spread spectrum communication system uses excess bandwidth to reduce the signal energy density, making interception difficult, some of the excess bandwidth is available for encoding the signal transmitted, thereby further reducing the signal energy per bit. In order to minimize the intercept of the transmission, it is necessary to use an energy efficient modulation and coding scheme. Thus, one of the first steps for processing the signal to be transmitted in such a system is to encode it using an error correction code. However, instead of using a simple binary convolutional encoding scheme, it is preferable to use an M-ary orthogonal convolutional code that encodes each bit of the input data at the transmitter using M different symbols ($M>2$) to represent the binary input data. The use of more than two redundant symbols in the encoding scheme increases the resilience of the transmitted signal to fading, jamming, and other noise problems.

An appropriate M-ary orthogonal convolutional error correction code is described by Bruce D. Trumpis in his Doctoral dissertation entitled, "Convolutional Coding for M-ary Channels," University of California at Los Angeles, 1975. However, the thesis only suggests that a standard Viterbi decoding technique could be used to decode the M-ary encoded signal. The prior art technique mentioned in this reference cannot accommodate without modification an 8-ary convolutional error correcting code, for example, which is the preferred format for encoding the spread spectrum signal in a low probability of intercept communication system that is being developed by the assignee of the present invention. In fact, a substantially different branch metric algorithm that is not disclosed in this thesis or in other prior art must be applied to decode an M-ary code, for $M>2$.

Accordingly, the present invention is directed to a decoder that implements a soft decision algorithm using maximum likelihood decoding, yielding excellent performance not only in a Gaussian noise environment, but also in a partial band-noise jammed channel.

SUMMARY OF THE INVENTION

In accordance with the present invention, a method for decoding a received signal that represents information bearing data comprising a plurality of bits is defined. The information bearing data are encoded with an orthogonal convolutional M-ary error correction code so that each bit of the information bearing data is represented by one of M possible symbols. Each of the M symbols is different from the others and M is greater than two. This method starts with the step of correlating the received signal to determine M correlation values, each correlation value corresponding to one of the M possible symbols. A plurality of branch metrics are then determined, where the branch metric for a symbol is equal to a difference between a maximum one of the M correlation values and the correlation value corresponding to that symbol.

Path metrics for all paths entering each of N different states are determined by adding the branch metric corresponding to a path from a previous state to a state metric of the previous state, for each of the N different states. By comparing the path metrics entering each of the N states, a minimum path metric for each state is selected and used as a new state metric for that state. Preferably, the step of selecting a minimum path metric comprises the step of normalizing the state metrics to reduce their magnitude. A data bit corresponding to the path metric selected in the preceding step is identified, and a path history is updated as a function of the path metric selected above. These steps are repeated until a predetermined number of iterations are completed, and the path metric determined in each iteration is stored in the path history. A minimum state metric of the state metrics is identified as a path metric, for each of the predefined number of iterations, to determine a most likely path through the path history. An output bit is then produced, as a function of an oldest state, by following the most likely path through the path history. This output bit represents the most likely value of a corresponding bit of the information signal that was encoded.

The steps outlined above are repeated for each successive bit encoded, until all bits of the information bearing data that were encoded are decoded. In one preferred form of the invention, M has a value of 8 and there are 64 possible states for the eight possible symbols.

A further aspect of the present invention is directed to apparatus for decoding an input signal encoded with an orthogonal convolutional M-ary error correction code, where each bit of information bearing data conveyed by the input signal is represented by one of M possible symbols, each of the M symbols is different from the others, and M is greater than two. The apparatus generally includes means for implementing each of the steps of the method discussed above.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Overview of the Communication System

Figure 1:
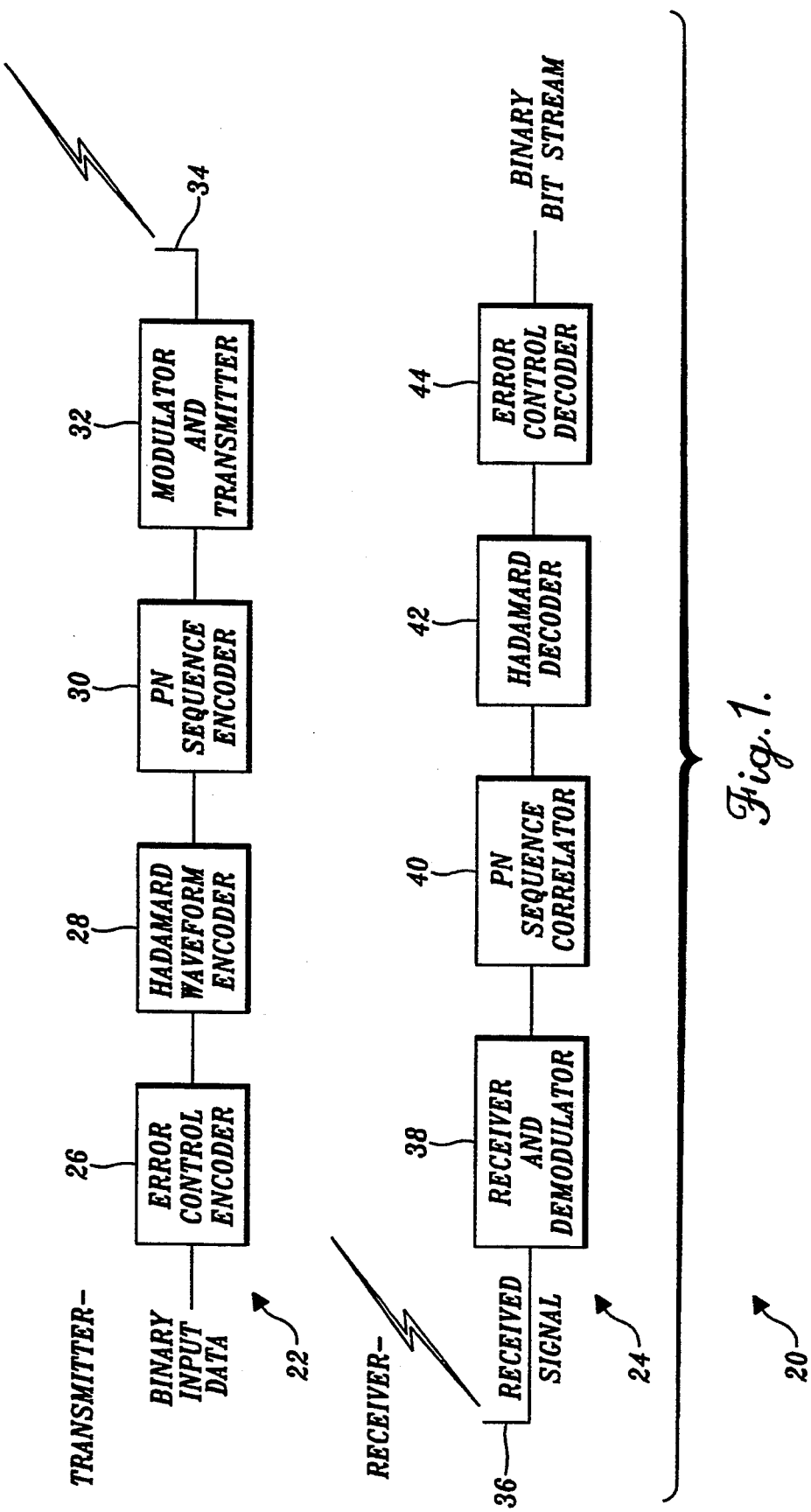
FIG. 1 is a block diagram of a communication system in which an error control decoder in accordance with the present invention is used to decode an M-ary orthogonal convolutional encoded signal.

As illustrated in FIG. 1, a communication link in a spread spectrum communication system 20 in which the present invention is used comprises a transmitter 22 that is transmitting radio signals to a receiver 24. Transmitter 22 is supplied with binary input data, comprising information to be conveyed from transmitter 22 to receiver 24. Spread spectrum communication system 20 is used to convey this information bearing data in an encoded form to ensure a low probability of intercept of the transmitted signal by some unauthorized receiver. The present invention has utility in spread spectrum communication system 20 because it facilitates decoding of the encoded data. It should be recognized, however, that the present invention is not limited to use in such a system.

The binary input data supplied to transmitter 22 is encoded by an error control encoder 26 using an 8-ary code. The symbols are determined by the following generator polynomials:

$$g1 = 1 + X^1 + X^2 + X^3 + X^4 + X^5$$

$$g2 = 1 + X^1 + X^3 + X^4 + X^6$$

$$g3 = 1 + X^2 + X^4 + X^5 + X^6 \quad (1)$$

The encoded symbols produced by error control encoder 26 are input to an orthogonal waveform encoder 28, which produces a set of N orthogonal signals, each of which is represented by a sequence of N bits.

Using the polynomial expressions of equations (1), error control encoder 26 encodes the binary input data to form three bit symbols for each bit of the binary input data. The binary input data are applied to a seven bit shift register 26a (shown in FIG. 2B). The shift register is initialized to zero; successive bits of the binary input data are shifted to the right in the shift register, yielding a different symbol for the data with each successive clock cycle as parity adders 27a, 27b, and 27c combine the bits in selected registers of the shift register to produce different three bit symbols. In the preferred embodiment, the convolutional encoding scheme has a constraint length of seven and employs an alphabet of eight symbols, i.e., (0,0,0), (0,0,1), (0,1,0), (0,1,1), (1,0,0), (1,0,1), (1,1,0), and (1,1,1). The orthogonal waveform encoder encodes each of these symbol into one of eight possible orthogonal words. Since orthogonal encoders are well known in the art and because it is not directly relevant to the present invention, details of the orthogonal encoder need not be disclosed.

In the spread spectrum communication system, the sequence of N binary bits output from the orthogonal waveform encoder are combined with a pseudorandom number (PN) binary sequence provided by a PN sequence encoder 30, and the resulting signal is modulated by a modulator and transmitter circuit (32) to produce a radio frequency (RF) signal that is transmitted from an antenna 34. The binary sequence provided by the PN sequence encoder has the characteristics of random noise, but it is deterministic and is reproducible in the intended receiver(s) of the signal. This spread spectrum signal comprises a plurality of "chips." Because the chip rate is higher than the data rate of the binary input data, the signal transmitted from antenna 34 produced by modulating the chips has a broader frequency spectrum than the binary input data and is not readily detected or intercepted.

The transmitted signal is received at receiver 24 by a corresponding antenna 36. From this antenna, the signal is input to a receiver and demodulator circuit 38, which down-converts the received signal and demodulates it. The same PN sequence used by transmitter 22 is also generated in receiver 24 by a PN sequence correlator circuit 40 and used to correlate the demodulated signal. Thus, the output of PN sequence correlator circuit 40 generally corresponds to the orthogonal waveform encoded signal that was input to PN sequence encoder circuit 30 in transmitter 22.

An orthogonal decoder circuit 42 then decodes the signal output from PN sequence correlator circuit 40, producing a signal that is applied to an error control decoder circuit 44, which is constructed and operates in accordance with the present invention. Orthogonal decoder circuit 42 correlates the signal supplied from PN sequence correlator circuit 40 with the eight different orthogonal words in the preferred embodiment, producing correlation values for each of the eight possible symbols.

Figure 2A:
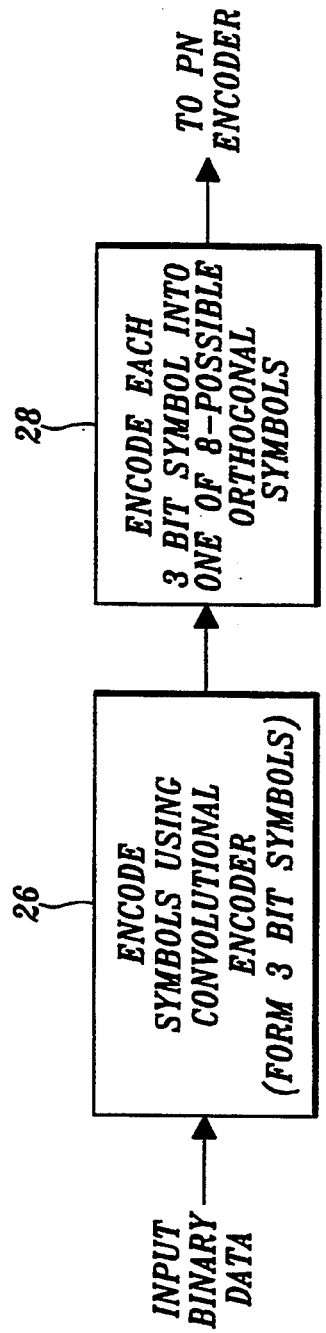
FIG. 2A is a more detailed block diagram that more clearly identifies the convolution encoder and an orthogonal encoder used in the communication system of FIG. 1.
Figure 2C:
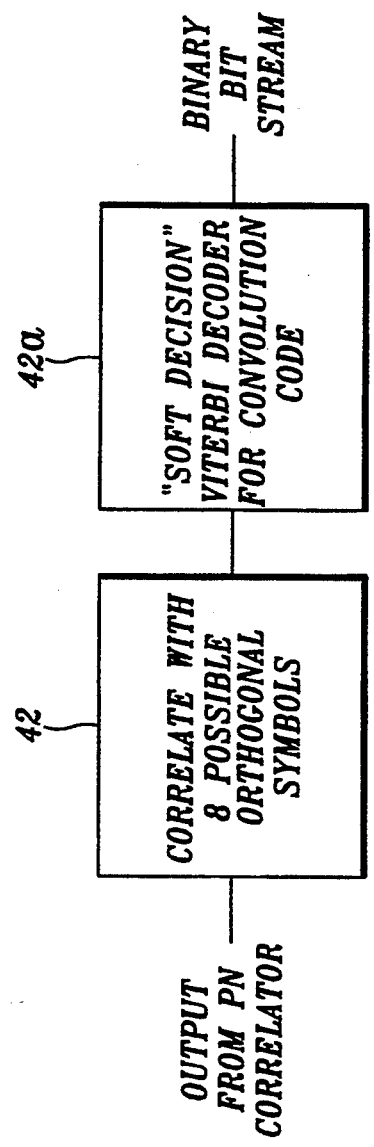
FIG. 2C is a more detailed block diagram of the error control decoder of FIG. 1.
Figure 2B:
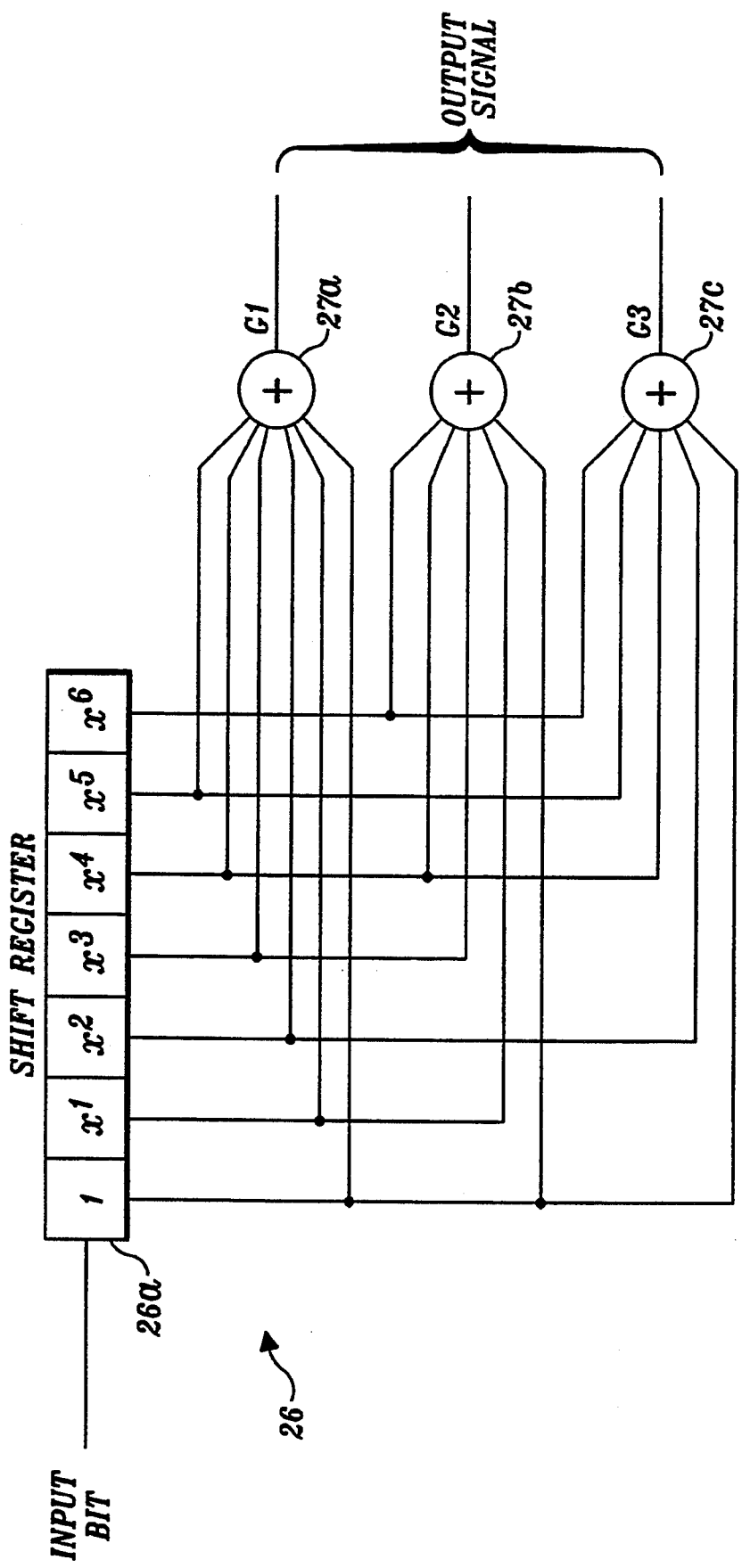
FIG. 2B is a schematic block diagram of the convolutional encoder.

As shown in FIG. 2C, a block 42a applies a soft decision modified Viterbi decoder algorithm. The soft decision Viterbi decoder uses a convolutional decoding approach, employing a branch metric that is unique to the present invention. This decoding scheme traces a sequential probability path history that is developed by processing branch metric values, enabling the soft decision Viterbi decoder to produce a decoded binary bit stream output, which, with a relatively high probability, represents the information originally transmitted.

Error control decoder circuit 44 (FIG. 1) processes the signal input to it, producing a decoded binary bit stream corresponding to the binary input data supplied to transmitter 22. Noise, fading, jamming and other effects that tend to produce errors in the received signal are more readily compensated because the binary input data were encoded as symbols. The soft decision Viterbi decoder technique employed by error control decoder circuit 44 decodes the signal from the orthogonal decoder, recovering data that would otherwise likely have been lost due to the errors introduced in the signal during its propagation from transmitter 22 to receiver 24. Although conventional Viterbi decoders are well known in the art, such devices are typically used for decoding only a binary convolutional code. In contrast, the present invention employs a novel branch metric technique to accommodate an M-ary code (where M is greater than 2 in the general case and equals 8 in the preferred embodiment).

Overview of the Error Control Decoder Circuit

Figure 3:
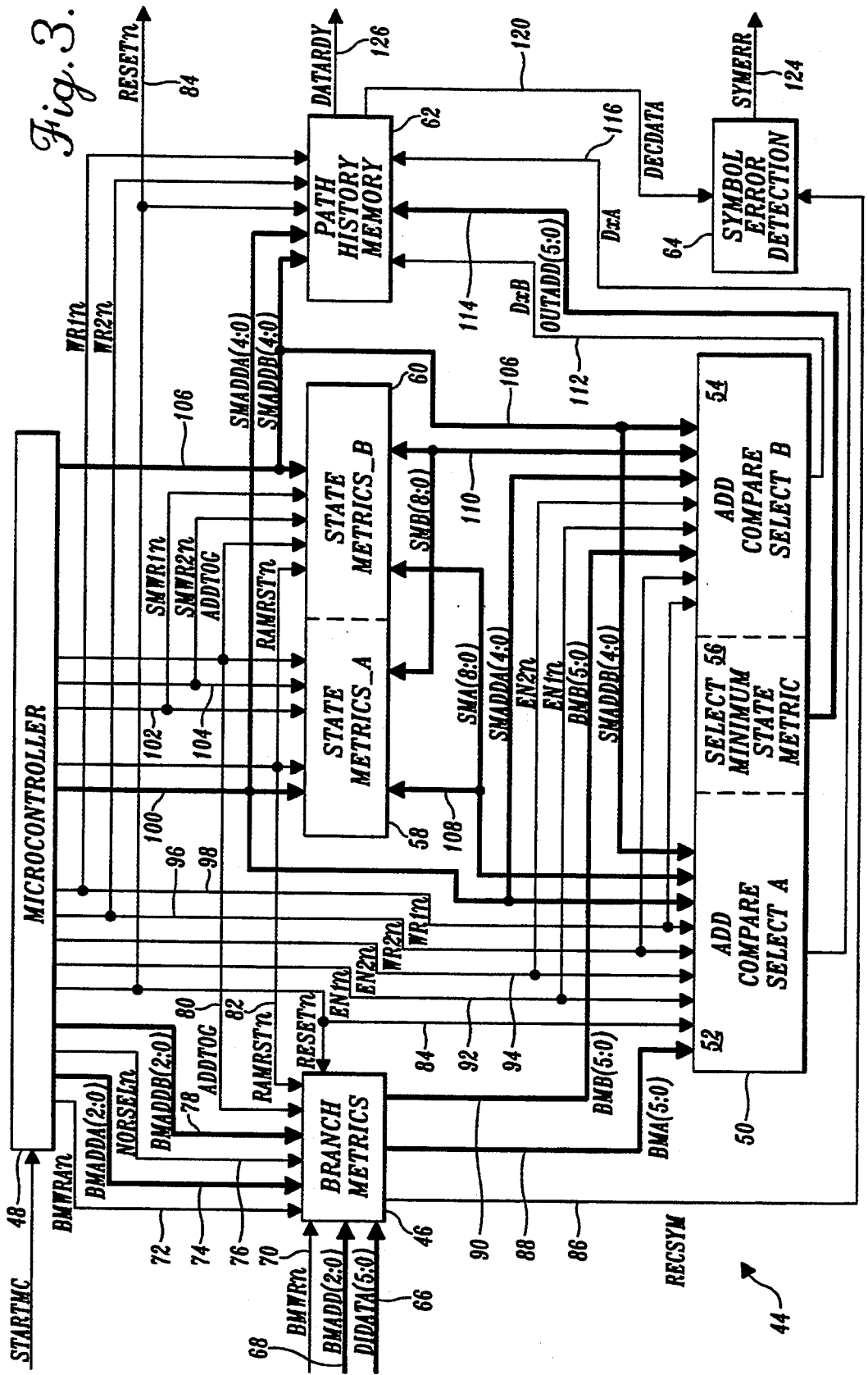
FIG. 3 is an overview of the error control decoder in block diagram form.

An overall schematic block diagram of error control decoder circuit 44 is shown in FIG. 3. Error control decoder circuit 44 includes a branch metrics module 46, which is controlled by a microcontroller 48 to carry out the soft decision Viterbi decoder technique. Also included in the error control decoder circuit are an add-compare-select module 50 that determines state metrics and path metrics to determine a path history. The add-compare-select module comprises an A module 52 and a corresponding parallel B module 54. A path history memory module 62 stores path history data that are used in decoding the encoded data. Error control decoder 44 also includes state metrics A and state metrics B modules 58 and 60, and symbol error detection module 64.

Microcontroller 48 accepts external control commands, including STARTMC (start microcontroller) and SYSRSTn (system reset-low) commands and responds to these commands to produce other internal commands and control signals necessary to carry out the decoding operation. The SYSRSTn command is generated, for example, after power is reapplied to the receiver, to reset the error control decoder. Although these components are not separately shown, the microcontroller includes a system clock counter and a read only memory (ROM) that produces a plurality of different control signals used by error control circuit 44. STARTMC starts the counter, causing it to count system clock cycles. The count accumulated by the counter is used to select sequential addresses in the ROM, causing a control signal corresponding to the addresses thus selected to be output. After cycling through all of the instructions stored in the ROM, the RESETn line is set low and the counter is reset until the next STARTMC command is applied, starting the operation over again. Control signals supplied through the microcontroller include SYSCLK (system clock), and SYMCLK (symbol clock).

During normal operation of error control decoder 44, a logic level 0 SYSRSTn signal is produced after power up to place the decoder in a known state. (Note that the "n" on the end of "SYSRSTn" and similarly, as used in the identification acronyms for other signals shown in the Figures, indicates that a "NOT" or inverted logic signal initiates the indicated control action.) On application of the SYSRSTn, a RESETn control signal from the microcontroller goes low (logic level 0), which resets most of the registers and other components in the error control decoder. A MRSTn (ram reset) signal is held low during one complete cycle through the ROM, allowing registers and other elements in the decoder to initialize to zero before the error control decoder begins to decode an input signal.

Several different signal lines convey data/addresses into branch metrics module 46. DIDATA lines 66 convey 6-bit correlation values for each of the eight possible orthogonal words that were determined by orthogonal decoder 42. BMADD lines 68 convey a 3-bit branch metric address identifying the specific orthogonal word of the eight possible corresponding to the correlation value that is then being supplied to branch metrics module 46. BMWRn line 70 conveys a branch metric write signal to enable the correlation value currently being supplied to be written into memory in branch metrics module 46. A BMWRAn line 72 conveys a second branch metric write enable signal, but one that is supplied by microcontroller 48.

Microcontroller 48 is also connected to branch metrics module 46 by other signal lines. BMADDA lines 74 convey a branch metric 3-bit address to select a specific orthogonal symbol to be processed by branch metrics module 46. Each such symbol is processed by the error control decoder during an interval of time referred to herein as a "symbol period."

A NORSELn line 76 provides a NOR gate select signal used in branch metrics module 46. BMADDB lines 78 convey a second branch metric address used in the module. An ADDTOG line 80 provides an address toggle signal comprising an MSB of an address and is used to enable a double buffering scheme that permits addressing of different portions of the module with the same LSBs of the address. A RAMRSTn line 82 conveys a RAM reset signal from microcontroller 48 to branch metrics module 46. Similarly, a RESETn line 84 conveys the reset signal to the branch metrics module, add-compare-select module 50, and path history memory module 62. A RECSYM line 86 conveys a "received symbol" signal from branch metrics module 46 to symbol error detection module 64. This signal indicates the symbol having the greatest correlation value.

BMA lines 88 and BMB lines 90 convey a 6-bit branch metric that is output from branch metrics module 46 to add-compare-select A module 52 and add-compare-select B module 54, respectively. EN1n line 92 and EN2n line 94 convey enable signals from microcontroller 48 to each of the add-compare-select modules A and B. Similarly, WR2n and WR1n lines 96 and 98 convey write signals from the microcontroller to the add-compare-select modules to control timing.

Corresponding lines SMADDA and SMADDB are coupled to both state metrics A and B modules 58 and 60, and to add-compare-select A and B modules 52 and 54, conveying state metric addresses to select the specific state metric currently being processed. SMWR1n line 102 and SMWR2n line 104 connect microcontroller 48 to state metrics A and B modules 58 and 60, conveying state metric write signals from the microcontroller. SMA lines 108 and SMB lines 110 interconnect the state metrics A and B modules, and the add-compare-select A and B modules. A DxA line 116 and a DxB line 112 convey binary data from add-compare-select A module 52 and add-compare-select B module 54, to path history memory module 62 to indicate the path followed from one state to a successive state. This signal is used in defining a path history.

DECDATA lines 120 couple path history memory module 62 and symbol error detection module 64, conveying the decoded symbol from path history memory module 62 for comparison to the symbol that had the largest correlation value. A SYMERR line 124 conveys a signal that indicates whether the bit of the decoded data differs from the bit corresponding to the received symbol that had the largest correlation value. Data decoding does not begin until a signal carried by a DATARDY line 126, which is connected to path history memory module 62, indicates that at least a predetermined number of received symbols have been processed to produce a path history sufficiently long to accurately decode the encoded data.

Description of the Branch Metrics Module

Figure 4:
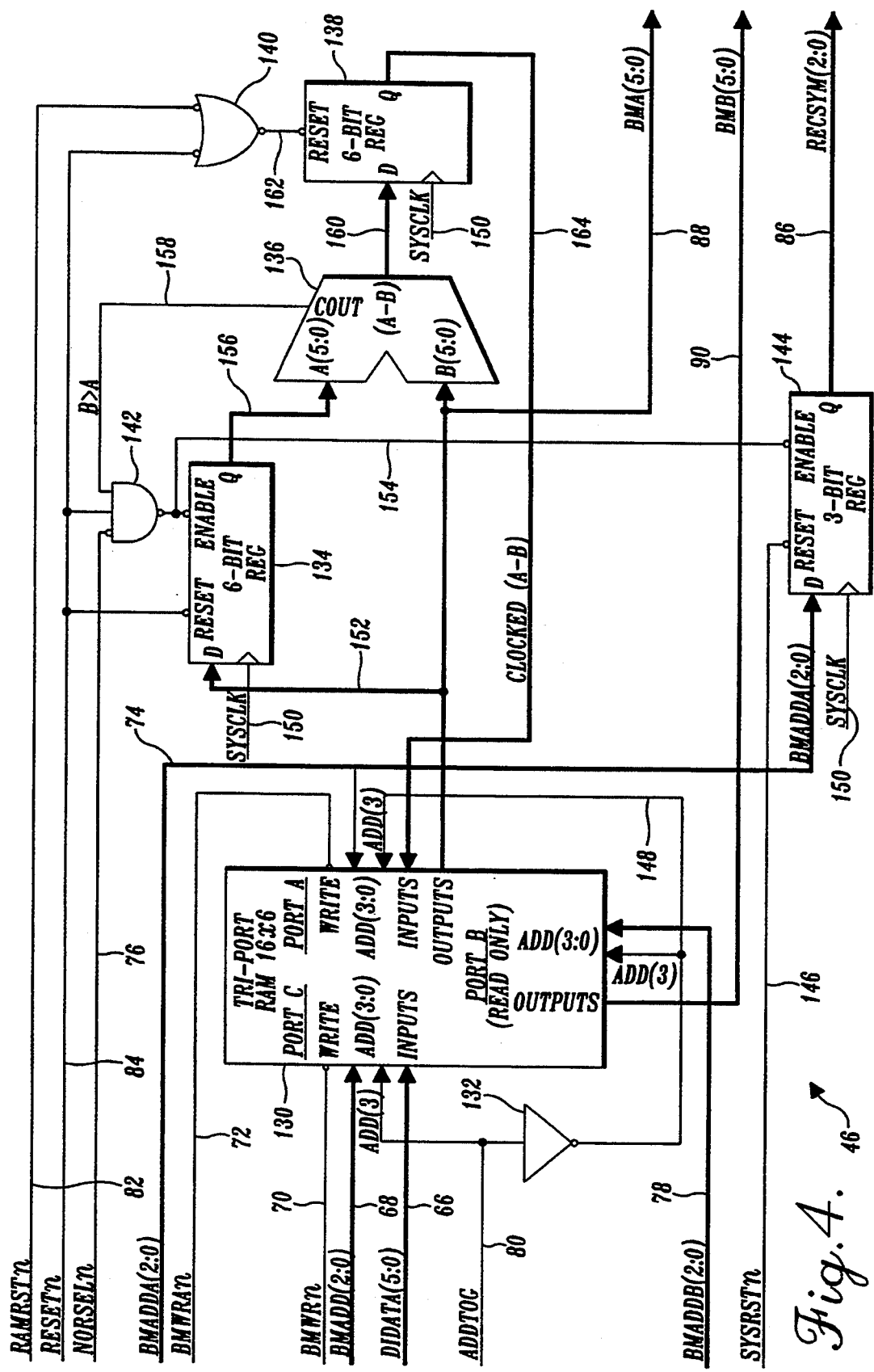
FIG. 4 is a schematic block diagram of a branch metric module of the error control decoder.

Details of branch metrics module 46 are shown in FIG. 4. The branch metrics module includes a tri-port random access memory (RAM) 130, which stores sixteen 6-bit words that are written through ports A and C and read through ports A and B. ADDTOG line 80 is connected to the MSB of an address terminal of port C on tri-port RAM 130 and to an inverter 132, which inverts the address toggle signal and conveys the inverted signal on a line 148 to the MSB of an address terminal of ports A and B. The branch metrics module also includes a 6-bit register 134, a digital subtraction module 136, a 6-bit register 138, a NOR gate 140, a NAND gate 142, and a 3-bit register 144.

A SYSRSTn line 146 conveys the system reset signal to 3-bit register 144. SYSCLK lines 150 are coupled to each of 6-bit registers 134 and 138, and to 3-bit register 144, providing a 20 megahertz system clock (in the preferred embodiment), which toggles the input signals of the registers from their D inputs to their Q outputs (if the registers are enabled by the signal applied to their enable terminals). Output data from port A of tri-port RAM 130 are conveyed on lines 152 to a B input of digital subtraction module 136 and to the D terminals of 6-bit register 134. The enable terminal of 6-bit register 134 is controlled by the signal from the output of NAND gate 142, which is also coupled through a line 154 to the enable terminal of 3-bit register 144. The output terminals of 6-bit register 134 are coupled through lines 156 into the A inputs of digital subtraction module 136. A line 158 conveys a carry out signal from the digital subtraction module to one of the two inverting inputs of NAND gate 142, the non-inverting input being connected to RESETn line 84. This carry out signal is high if the value of the data applied to the B inputs of the digital subtraction module is greater than the value of the data applied to the A inputs. The actual difference between the data supplied to the A and B inputs (A−B) is conveyed on lines 160 to the D inputs of 6-bit register 138. A reset signal is applied through a line 162 to a reset terminal of this 6-bit register from the output of NOR gate 140. The difference between the data applied to the A and B inputs of digital subtraction module 136 is clocked out of the 6-bit register with each system clock 150 on lines 164; these lines are connected to the inputs of port A on tri-port RAM 130.

The operation of branch metrics module 46 is as follows. Each bit of information that is transmitted is represented by one of eight orthogonal words or symbols in the preferred embodiment. Orthogonal decoder 42 determines a correlation value for each of the eight possible symbols; these correlation values can range between 0 and 63, inclusive. BMADD lines 68 identify the specific one of the eight possible orthogonal words or symbols that is currently being input to port C of tri-port RAM 130, and the corresponding correlation value of that symbol is supplied over DIDATA lines 66 from the orthogonal decoder. The correlation value corresponding to the symbol determined by the orthogonal decoder are written into port C of the tri-port RAM in response to the branch metric write signal on BMWRn line 70. The signal on ADDTOG line 80 determines whether the correlation data are written in the lower eight storage addresses or the upper eight and alternates between a logic level 0 and 1 at the symbol rate. The inverted address toggle signal carried on line 148 is applied to the address terminals of both port A and port B, so that these ports address data in the eight storage locations to which correlation data are not being written through port C. This double buffering scheme allows correlation data to be written through port C, while data previously stored in the other eight storage addresses of tri-port RAM 130 are being read from ports A and B or written through port A from 6-bit register 138.

Initially, 6-bit register 134 is reset and its Q output terminals are set to a logic level 0. When microcontroller 48 receives the STARTMC signal, the error control decoder begins processing data previously written to tri-port RAM 130 on port C. The correlation values previously written to port C and stored in tri-port RAM 130 (for the eight possible symbols) are output on lines 152 from port A to both 6-bit register 134 and digital subtraction module 136, in response to addresses BMADDA provided by the microcontroller. If the data on the B terminals of digital subtraction module 136 are greater than the data applied to the A terminals of the digital subtraction module from 6-bit register 134, the COUT (carry out) line of the module goes high, causing the enable line of 6-bit register 134 to go low; the data on the D inputs of 6-bit register 134 are then latched. At that time, the correlation value for another of the eight possible symbols is applied to the B terminals of the digital subtraction module for comparison to the correlation value just clocked through 6-bit register 134. In this manner, the correlation values corresponding to the eight possible symbols are compared to each other, leaving the largest of the correlation values stored within 6-bit register 134.

While 6-bit register 134 latches the maximum correlation value, 3-bit register 144 latches the symbol (address) corresponding to that maximum correlation value. The symbol retained in 3-bit register 144 thus corresponds to the symbol probably transmitted (assuming that it was not affected by noise, jamming or fading) and is retained in the register as the enable line to the 3-bit register is set off by NAND gate 142 to latch the value currently being supplied over BMADDA lines 74 by microcontroller 48. This symbol, which represents the symbol that a hard decoder would have decoded, is conveyed to symbol error control detector 64 on RECSYM lines 86 for subsequent comparison to the symbol decoded by the soft decoder of the present invention.

After the largest correlation value of the eight symbols has thus been determined, a second pass through the eight correlation values is carried out to determine the difference between the largest correlation value and each of the eight correlation values. The differences between the largest correlation value and the correlation value for each of the symbols are conveyed to 6-bit register 138 from the output of digital subtraction module 136, and each difference value is clocked out at the next system clock over lines 164 to port A, for temporary storage in tri-port RAM 130. These eight difference values are the branch metrics for one symbol that was transmitted.

Description of the State Metric Modules

The branch metrics stored in tri-port RAM 130 are used for the path metric computation, but first, state metrics must be determined. Before the branch metric values are processed, the initial state metric values are set to zero. To increase the overall throughput, the path metric computation and the state metric update are split into two halves, thereby enabling the processing to be carried out more efficiently in parallel operations. Each half of the components that do these computations processes 32 of the 64 states associated with the eight possible symbols. Thus, the add-compare-select module comprises two identical sections that share the processing load, including add-compare-select A module 52 and add-compare-select B module 54. One of these modules processes states 0–31 and the other processes 32–63.

The state metric computation and its use in determining the path metric is relatively straightforward in principle, but somewhat more complicated in the details of the process. As a brief overview, a branch metric value selected by microcontroller 48 and provided on either BMA lines 88 and BMB lines 90 is added to a stored state metric value for a previous state, to determine a current state metric, and this process is repeated for each of the 64 possible states in each successive symbol period. For each symbol period, select minimum state metric module 56 then determines the minimum of the 64 state metric values thus computed, to identify a path metric for that symbol period. Path metrics for successive symbol periods are stored to produce a path history. To prevent the magnitude of the state metrics from increasing to unmanageable levels, the state metrics are normalized during each symbol period by subtracting the minimum state metric of the preceding symbol period from all of the state metrics in the current symbol period. Use of the path history to determine the symbols most likely transmitted is explained below.

Figure 5:
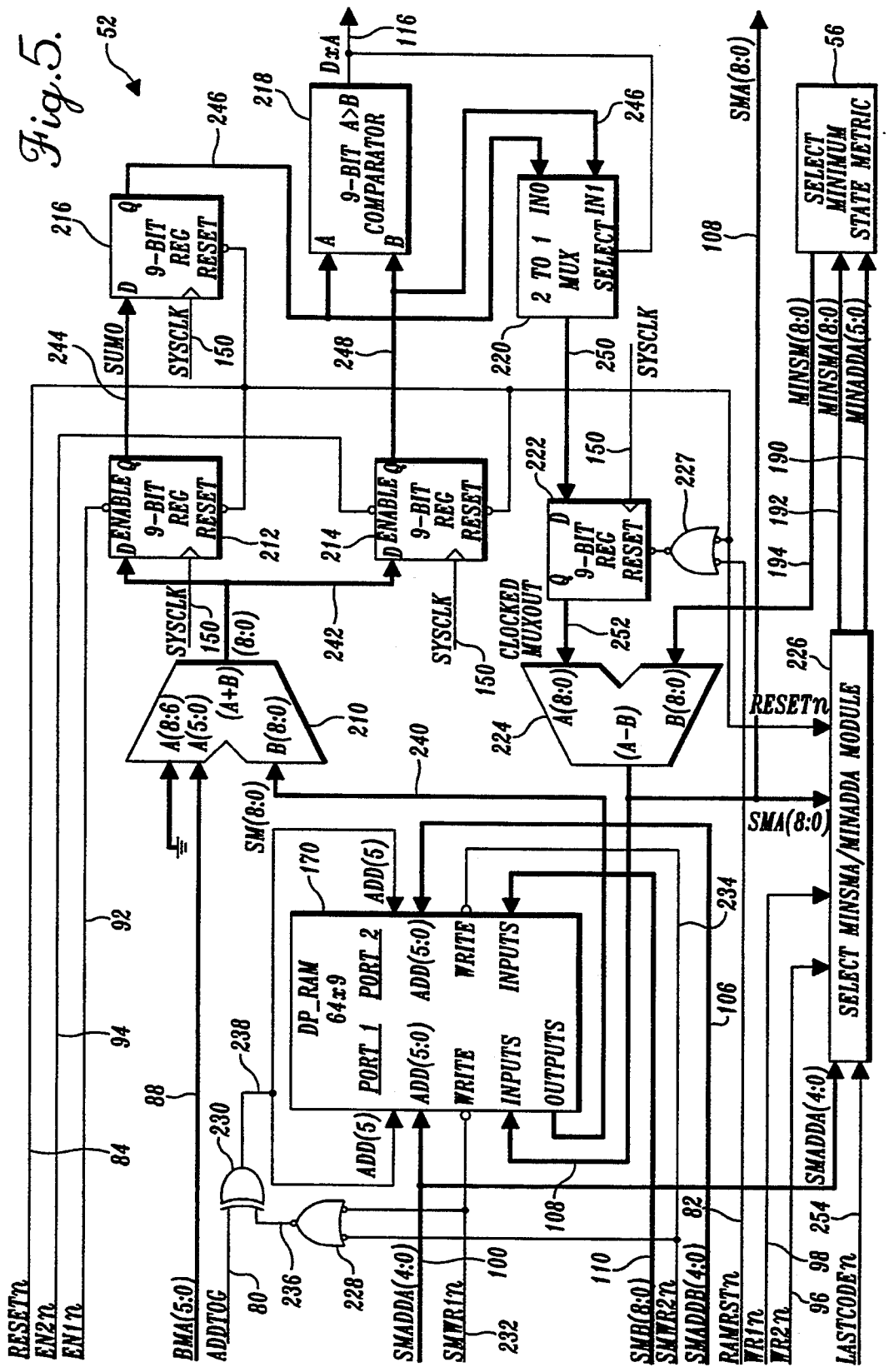
FIG. 5 is a schematic block diagram of one of the two identical state metric modules used in the error control decoder and its associated add-compare-select module.

Details of add-compare-select A module 52 are shown in FIG. 5. The same structure is used for add-compare-select B module 54. Add-compare-select A module 52 includes a digital adder module 210, 9-bit registers 212, 214, and 216, a 9-bit comparator 218, a 2:1 multiplexer (MUX) 220, a 9-bit register 222, a digital subtraction module 224, NOR gates 227 and 228, and an XOR gate 230. The reset terminal of 9-bit register 222 is connected to the output of NOR gate 227, which has inputs connected to receive the reset signals conveyed on RESETn line 84 and on RAMRSTn line 82. Accordingly, it should be evident that 9-bit register 222 is reset if either of these reset signals are at logic level 0.

The function of digital adder module 210 is to add a selected branch metric value to a state metric value. Since the branch metric values are only 6 bits and the state metric values are 9 bits, the three MSBs of the input at an A terminal of the digital adder module are grounded, so that they are always at a logic level 0. The state metric value input to the B terminal of digital adder module 210 is provided from port 1 output terminals of dual port RAM 170 and selected in response to the state metric address supplied to port 1 on SMADDA lines 100. SMA dual port RAM 170 is loaded with 64 9-bit state metric values over SMA lines 108 and SMB lines 110 and these state metric values are stored at addresses conveyed on SMADDA lines 100 and SMADDB lines 106, respectively. The sixth or MSBs of these addresses are provided by the output of exclusive XOR gate 230, which has inputs connected to the address toggle signal conveyed on ADDTOG line 80, and to the output of NOR gate 228, which is conveyed on a line 236. The inputs to NOR gate 228 are state metric write signals conveyed on SMWR1n line 232 and SMWR2n line 234. The state metric write signals are also connected to write enable terminals of dual port RAM 170. If either state metric write signals are at logic level 0 (to enable a write), the output of NOR gate 228 is at logic level 0, causing the MSBs of the addresses for ports 1 and 2 to be at logic level 0 so long as the address toggle signal is a logic level 0. If the address toggle goes high, the most significant address bit becomes 1. Alternatively, if both of the state metric write signals are a logic level 1 (indicating a read condition) and the address toggle signal is a logic level 0, the MSBs of the address for each of the two ports is set to a logic level 1. Using this double buffering technique, writes are done to one half of the memory locations in the dual port RAM, while data are read from the other half; the half selected for a particular operation is determined by the ADDTOG signal on line 80, which changes state every symbol period. This dual buffer memory configuration allows reading an old state metric, updating it, and storing a new state metric value without destroying the old state metric.

A brief discussion of the operation performed in the add-compare-select modules may help to make clear the following detailed description of these components. For each of the 64 possible state metrics, there are two possible paths or branches from state metrics determined in a previous symbol period that could be followed to reach the current state metric, and each of these two possible paths or branches is associated with a different one of the eight branch metric values. One of these two paths will have either a greater probability of being the correct path to a given state than the other path or the same probability. The probability of a path is determined by adding the branch metric associated with each path to its corresponding prior state metric; the path with the lower sum is the path with the greater probability. If the sums are equal for the two possible paths to a state (equal probability), either path can be selected. This process is repeated for each of the 64 states.

Digital adder module 210 thus determines the sum of the previous state metric and the branch metric associated with the path to the current state for each of the two possible paths. The minimum of these two sums (or either sum, if they are equal) is then determined by 9-bit comparator 218 and after being "normalized," is stored as the new state metric for the current state.

The sum of the selected branch metric and state metric value produced by digital adder module 210 is conveyed on lines 242 to the D terminals of 9-bit registers 212 and 214. An enable signal is conveyed on EN1n line 92 to the enable terminal of 9-bit register 212, and a corresponding signal is conveyed on EN2n line 94 to 9-bit register 214. So long as these enable signals permit, the sum from digital adder module 210 is conveyed to the Q terminals of each of these registers with the next system clock, which is coupled to the clock terminals of all of the registers in the add-compare-select module on lines 150.

A SUMO line 244 conveys a sum of the selected branch metric and state metric values that were added from the output of digital adder module 210 to the D terminals of 9-bit register 216, clocking the sum to the Q terminals of the 9-bit register at the next clock signal. While it is thus delayed, a sum of another selected branch metric and state metric (the second path to the current state) is output from digital adder module 210 and clocked through 9-bit register 214 to the B terminals of 9-bit comparator 218. The A terminals of the 9-bit comparator are connected to receive the delayed sum from the previous addition, i.e., the sum for the first path to the present state, for comparison to the sum for the second path, enabling the two sums for the two paths to be compared.

If the previous sum applied to the A terminals is greater than the current sum applied to the B terminals, a logic level 1 signal is output on line DxA line 116, which is coupled to a select terminal of 2:1 MUX 220. The values coupled to the A and B terminals of 9-bit comparator 218 are also coupled to the input terminals of 2:1 MUX 220; the DxA signal on its select terminal causes the 2:1 MUX to select the minimum of the two sums for output on lines 250. This minimum sum is input to the D terminals of 9-bit register 222 and clocked out of the Q terminals on lines 252 at the next system clock. Lines 252 are coupled to the A terminals of digital subtraction module 224.

The B terminals of digital subtraction module 224 are coupled to MINSM lines 194, which convey a minimum state metric (of the 64 state metric values determined during the preceding symbol period) chosen by select minimum state metric module 56. The minimum state metric from the preceding symbol period is subtracted from each of the state metric values output from 9-bit register 222. The purpose of this subtraction is to reduce the maximum size of the state metric values by normalizing the present state metric values with respect to the minimum of the 64 previous state metric values to prevent an overflow condition, since only 9-bits are allocated to storing each of the state metric values. The result of this subtraction is conveyed on SMA lines 108 to the input of dual port RAM 170 for temporary storage therein and is also input to select minimum state metric A/minimum address A (MINSMA/MINADDA) module 226 on SMA lines 108.

Figure 6:
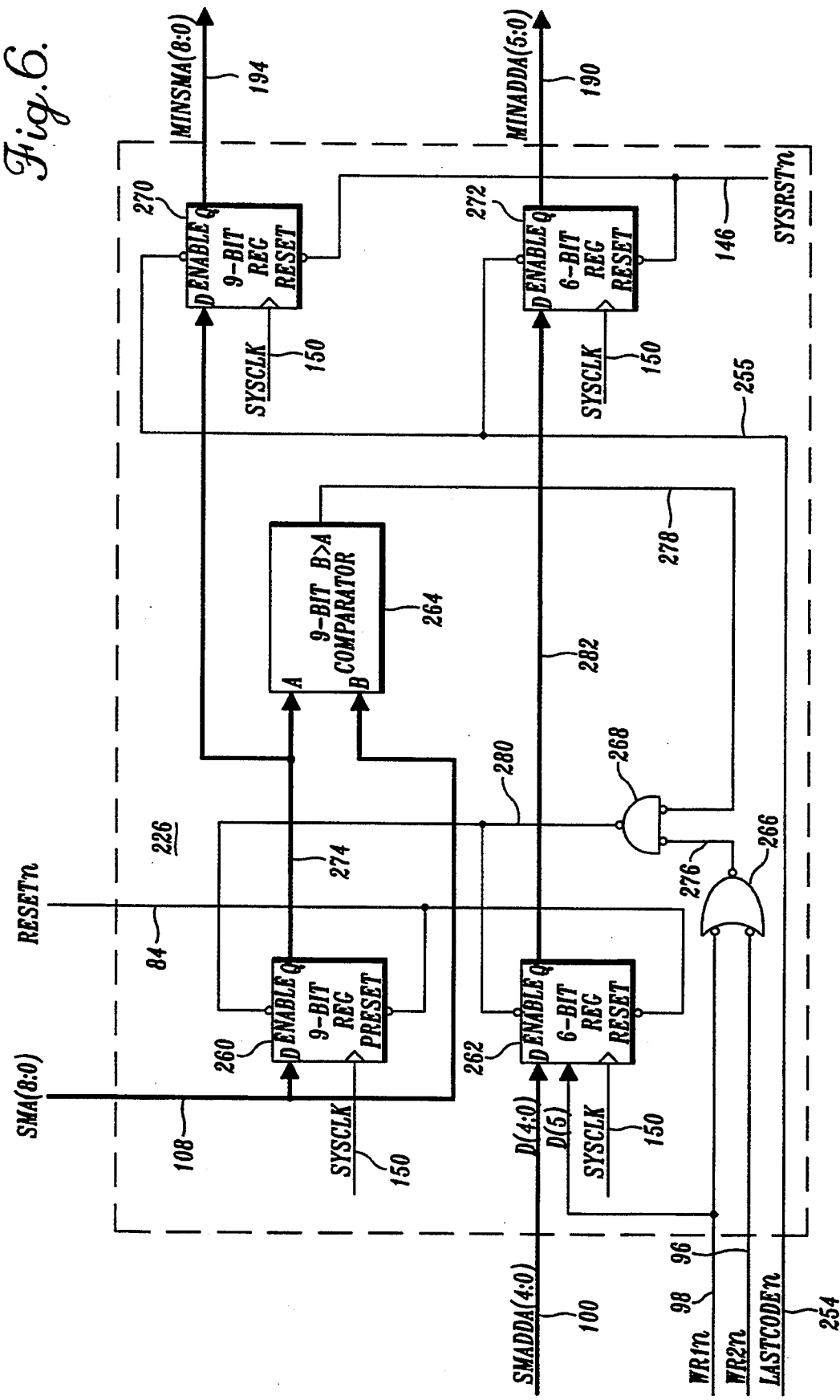
FIG. 6 is a detailed schematic diagram of one of the select minimum state metric/minimum address modules indicated in FIG. 5.

Details of select MINSMA/MINADDA module 226 are illustrated in FIG. 6. This module includes a 9-bit register 260, a 6-bit register 262, a 9-bit comparator 264, a 9-bit register 270, and a 6-bit register 272. SYSRSTn line 146 is coupled to the reset terminals of 9-bit register 270 and 6-bit register 272. In addition, the module includes a NOR gate 266 and a NAND gate 268. During each symbol period, 32 successive state metric values are input to the select MINSMA/MINADDA module on SMA line 108, along with the corresponding address of the state metric values, which is input on SMADDA lines 100. The state metric values are applied to the D terminals of 9-bit register 260 and clocked through to the Q terminals with the next system clock if the enable signal applied to the enable terminal of 9-bit register 260 is set appropriately (i.e., to a logic level 0). A logic level 0 signal is applied to the enable terminal of 9-bit register 260 by NAND gate 268 when both of the two inputs to NAND gate 268 are at a logic level 0. One of the inputs to this NAND gate is provided through a line 276 from the output of NOR gate 266 and is at a logic level 0 if either inputs of NOR gate 266 is at a logic level 0 (consistent with selection of the write state). The inputs to NOR gate 266 are write enable signals carried by WR1n line 98 and WR2n line 96. The second input to NAND gate 268 is from the output of 9-bit comparator 264, which is at a logic level 0 whenever the value applied to the B terminals of the comparator is less than the value applied to the A terminals. Lines 274 connect the Q terminals of 9-bit register 260 to the A terminals of 9-bit comparator 264, while the B terminals of the comparator are connected to SMA lines 108 to receive the current state metric value. Thus, 9-bit comparator 264 compares the current state metric with a previous state metric and produces a logic level 0 if the current state metric is less than the previous state metric value that is latched into 9-bit register 260. If the state metric value latched in 9-bit register 260 is larger than the current state metric value, it is replaced by the current state metric.

In this manner, successive comparisons are made between the state metric values for the state metric A module until all 32 state metrics in the state metric A module have been compared to each other. The state metric value latched in 9-bit register 260 represents the minimum state metric of the 32 state metrics for a given symbol period, corresponding to the state metric address (SMADDA) that is then latched in 6-bit register 272. Microcontroller 48 provides a signal on LAST-CODEn line 254 to indicate that all of the 32 state metric values stored in state metric module A have been compared for a symbol period, and this last code signal is applied over a line 255 to an enable terminal of 9-bit register 270, causing it to clock that minimum state metric value out of its Q terminals, over MINSMA lines 194. At the same time, 6-bit register 272 is enabled by the last code signal to clock the corresponding state metric address of the minimum state metric A value that has been latched into 6-bit register 262, out of its Q terminals over MINADDA lines 190. The state metrics for the other 32 states and their minimum state metric are similarly determined by state metric module B in a parallel process.

Figure 7:
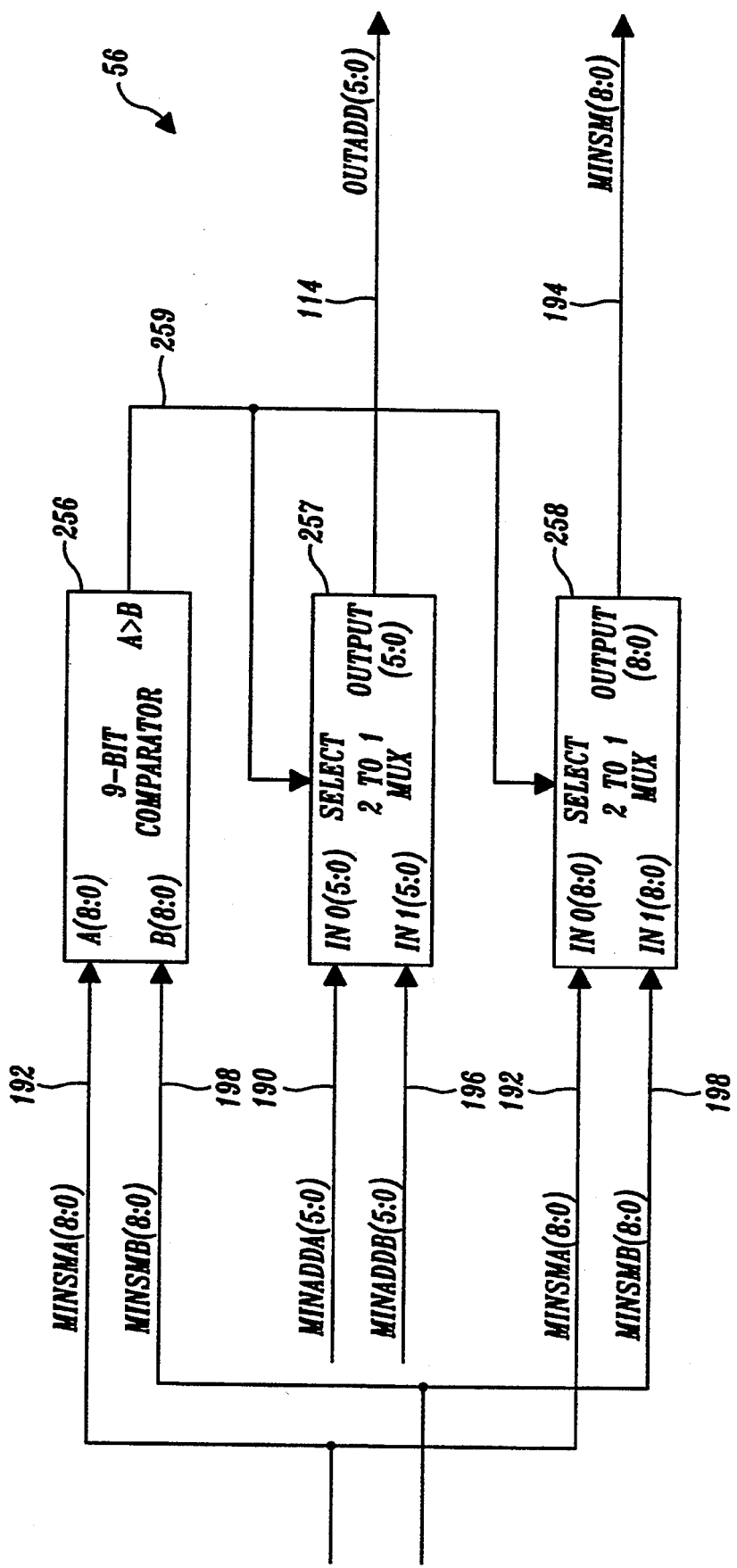
FIG. 7 is a detailed schematic diagram of a select minimum state metric module indicated in FIG. 5.

FIG. 7 shows details of select minimum state metric module 56, which includes a 9-bit comparator 256, a 2:1 MUX 257 and a 2:1 MUX 258. Nine-bit comparator 256 compares the minimum state metric determined by add-compare-select A module 52 (for the lower 32 state metrics, states 0-31) with the minimum state metric determined by add-compare-select B module 54 (for the higher 32 state metrics, states 31-63). These minimum state metric values from add-compare-select A and B modules 52 and 54 are conveyed over MINSMA lines 192 and MINSMB 198, respectively. A logic level 1 is output from 9-bit comparator 256 if the value of the minimum state metric determined by add-compare-select A module 52 is greater than the minimum state metric found by add-compare-select B module 54. This logic level is applied to the select terminal of both 2:1 MUX 257 and 2:1 MUX 258. In response to the logic level applied to its select terminal, 2:1 MUX 257 selects between the corresponding addresses for the minimum state metric values from the add-compare-select A and B modules, producing an output corresponding to the address of the state metric having the lower value on OUTADD lines 114. The actual value of the minimum state metric thus selected is output from 2:1 MUX 258 on MINSM lines 194 in response to the select signal.

Description of the Path History Module

For each successive symbol period, a path metric value that is either a logic level 1 or 0 is supplied to path history module 62 over either the DxA or DxB lines for storage in the path history memory. The path history memory stores the path history for only 36 symbol periods. Ideally, the maximum probability in the symbol decoded would be obtained by storing and tracing back through the entire path history for all of the symbols transmitted, but the requirements in storage and processing time would be prohibitive. In fact, there is a point of diminishing returns in increasing the number of path metrics that are processed to determine the symbols transmitted beyond about five times the constraint length of the encoded symbols. For the constraint length used in the encoding scheme of the preferred embodiment, it has been determined that a path history limited to about 36 symbol periods provides an optimum compromise.

Much of the path history module is devoted to the details of storing the path metrics for 36 symbol periods in a random access memory and then accessing the path metrics thus stored to trace back through the path history to determine the data most likely transmitted 35 symbols periods ago. As this process is repeated during successive symbol periods, the oldest path metric is dropped from the memory and the current path metric is stored therein. The storing and tracing back through the trellis of paths stored in the path history memory continues until the last of the symbols transmitted has been decoded and the data determined. The preferred embodiment employs techniques to carry out these functions that are specific to components selected for the path history module, but it should be apparent that other more conventional approaches can also be used to implement the functions of the path history module.

Figure 8:
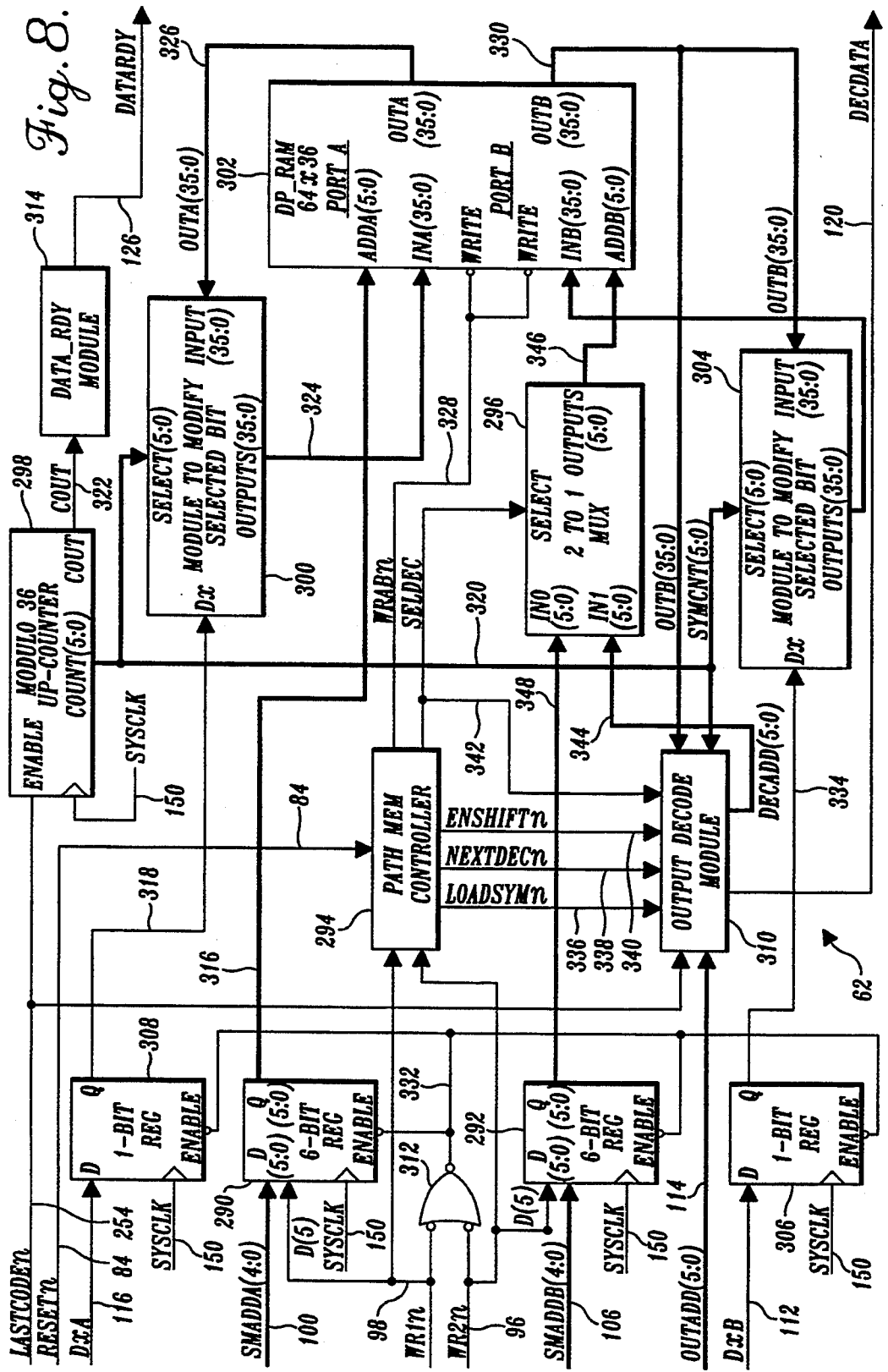
FIG. 8 is a block diagram of a path history memory module in the error control decoder.

Referring now to FIG. 8, it will be noted that path history module 62 includes 6-bit registers 290 and 292, a path memory controller 294, a 2:1 MUX 296, a modulo 36 up-counter 298, modules to modify selected bit 300 and 304, a dual port RAM 302, 1-bit registers 306 and 308, and an output decode module 310. In addition, the path history memory module includes a NOR gate 312, and a data ready module 314. Path memory controller 294 is reset or initialized by a signal on RESETn line 84 and thereafter, responds to the write enable signals on WR1n line 98 and WR2n line 96.

As each successive state is selected during a symbol period in response to the state metric address supplied to the add-compare-select A and B modules on the SMADDA lines 100 and the SMADDB lines 106 by microcontroller 48, the addresses for the selected state metrics are clocked through 6-bit registers 290 and 292 (so long as the enable inputs of these registers are appropriately set). The enable terminals of 6-bit registers 290 and 292 are coupled by a lead 332 to the output of NOR gate 312, which has its two inputs connected to WR1n line 98 and WR2n line 96. In addition, lead 332 is connected to the enable terminals of 1-bit registers 306 and 308 to enable the transfer of the logic level 1 or 0 conveyed on DxB line 112 and DxA line 116, respectively, between the D and Q terminals of the 1-bit registers with the next system clock provided on SYSCLK lines 150.

It will be recalled that the signals conveyed on the DxA line 116 and the DxB line 112 are set to either a logic level 0 or 1 to indicate the path used in updating a state metric value. The Q terminal of 1-bit register 308 is connected through a lead 318 to a Dx terminal of module to modify selected bit 300. Similarly, the Q terminal of 1-bit register 306 conveys the clocked logic level applied to the D terminal of the 1-bit register over a line 334 to a Dx terminal of module to modify selected bit 304. The signals on WR1n line 98 and WR2n line 96 are also used as the sixth MSBs, in combination with the 5-bit addresses conveyed on SMADDA lines 100 and SMADDB lines 106, respectively, determining whether the addresses are for the lower 32 states 0-31 or the upper 32 states 32-63. These write signals are also applied to path memory controller 294.

At the end of each symbol period, the signal on LASTCODEn line 254 enables modulo 36 up-counter 298 and output decode module 310. The modulo 36 up-counter counts symbol periods until it reaches a total count of 36, as indicated by a 10 carry-out signal that is conveyed on a line 322 to data ready module 314. The actual count of modulo 36 up-counter 298 is conveyed on SYMCNT lines 320 to both output decode module 310 and modules to modify selected bit 300 and 304. The purpose of modulo 36 up-counter 298 is to ensure that at least 36 symbols have been received to establish a path history before the first decode data out is enabled and to provide a symbol count that is used in updating the path history. Data ready module 314 produces a signal on DATARDY line 126 indicating that the required minimum 36 symbol periods worth of path history data have been determined to provide a data valid indication to external circuitry in the receiver.

Path memory controller 296 produces signals on a LOADSYMn line 336, a NEXTDECn line 338, and an ENSHIFTn line 340. In addition, it produces a signal controlling the write terminals of ports A and B of dual port RAM 302 that is conveyed on a WRABn line 328. A select signal is provided by path memory controller 294 and conveyed on a SELDEC line 342 to both output decode module 310 and 2:1 MUX 296.

The address of the minimum state conveyed on OUTADD line 114 is supplied to output decode module 310. The output decode module produces a signal on DECADD lines 344 that is coupled to one of the two inputs of 2:1 MUX 296. The other input of the 2:1 MUX is connected to receive the clocked state memory address, which is carried on SMADDB lines 348. In response to the select signal provided by path memory controller 294, 2:1 MUX 296 selects one of the addresses provided on its two inputs for output on lines 346, which are coupled to ADDB terminals of port B on dual port RAM 302. Corresponding ADDA terminals of port A on the dual port RAM are coupled by lines 316 to the Q terminals of 6-bit register 290, for conveying the clocked address of the state memory provided by microcontroller 48. For each state memory address that is thus input to port A and port B of the dual port RAM, a corresponding value for Dx, either DxA or DxB, is provided.

It is helpful to visualize storage in dual port RAM 302 as being organized into an array of 64 rows and 36 columns. The 64 values for DxA and DxB (defining the path to each state selected during a symbol period) are thus stored in dual port RAM 302 in one of the 36-columns, the specific column depending upon the symbol count provided by modulo 36 up-counter 298. OUTA lines 326 convey the 36 path values for a selected row of the 64 rows of data stored in the dual port RAM to the input of the module to modify selected bit 300, whereas OUTB lines 330 couple the corresponding output from port B to the input of module to modify selected bit 304 (and during a second pass, to output decode module 310). The modules to modify selected bit update the path data for a selected column of the array of path history data based upon the symbol count, the next column to the right in the array representing the oldest of the path history data. When the selected column is the 36th, the oldest of the path history data is in the first column of the array, and therefore, the selected column wraps around from the last to the first when the symbol count from the modulo 36 up-counter starts over at zero after reaching a total count of 36.

Figure 9:
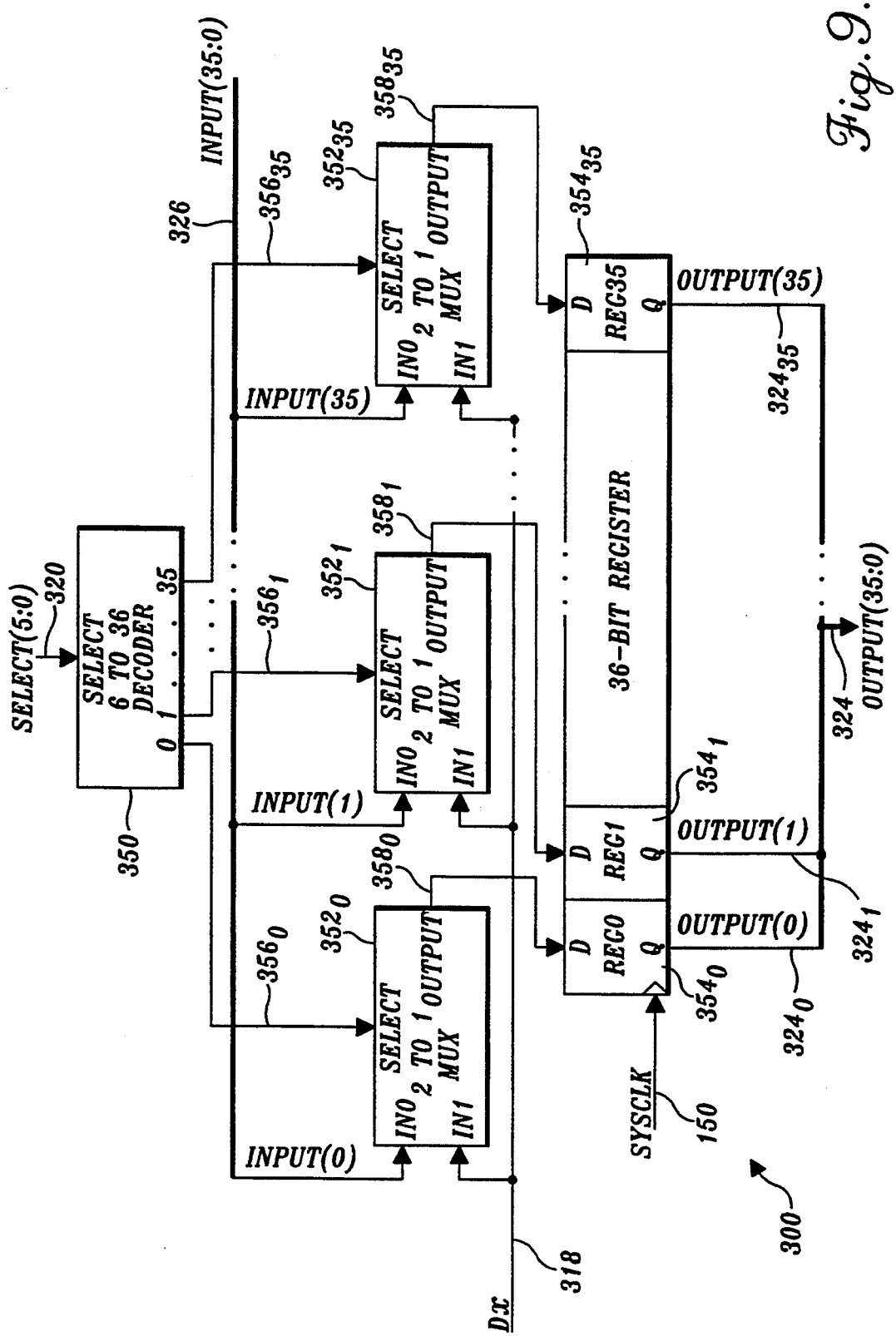
FIG. 9 is a schematic diagram of one of the two modules "to modify selected bit," as indicated by one of the blocks in FIG. 8.

Module to modify selected bit 300 (which is exemplary of module to modify selected bit 304) is shown in FIG. 9. This module includes a 6:36 decoder 350, 36 2:1 MUXs $352_0$–$352_{35}$, and a 36-bit register 354, which comprises 36 1-bit registers $354_0$–$354_{35}$. The current symbol count from modulo 36 up-counter 298 is input to the select terminal of 6:36 decoder 350 on SYMCNT lines 320. This symbol count, which ranges between zero and 35 in value, is decoded to select one of 36 output lines $356_0$–$356_{35}$. Each of these lines is connected to a different 2:1 MUX $352_0$–$356_{35}$, to select one of the two inputs of each of the 2:1 MUXs for its corresponding output. Only one of the signals conveyed on lines $356_0$–$356_{35}$ is a logic level 1, and consequently, only one of the 2:1 MUXs $352_0$–$352_{35}$ has its select terminal energized to enable the logic level input on Dx line 318 to be output on one of lines $358_0$–$358_{35}$. Lines $358_0$–$358_{35}$ connect the 2:1 MUXs to corresponding 1-bit registers $354_0$–$354_{35}$. The 2:1 MUXs that do not have their select terminal energized with a logic level 1 select the corresponding 0–35 bit that is applied to their other input as the value that is provided to the corresponding 36-bit register $354_0$–$354_{35}$. Accordingly, each of the 36 counts totaled by modulo 36 up-counter 298 results in a successive one of the 36-bit registers being updated with the then current logic value of Dx line 318 and this step is repeated 64 times so that the Dx values for all 64 states are similarly updated during that symbol period count. The output from 36-bit register 354 updates the path history for one state during the current symbol period and is written back to the input terminals of port A in dual port RAM 302 and stored therein in a row determined by the address provided on ADDA or ADDB terminals of port A and B, respectively.

Referring back to FIG. 8, 2:1 MUX 296 determines the address supplied to ADDB terminal of port B over lines 346. While the path history is being updated, 2:1 MUX 296 selects the docked address on lines 348, but during a data decode operation, it selects the decoded address provided on DECADD lines 344, in response to the signal provided on SELDEC line 342. During the decode operation and in response to the address that is thus provided to the ADDB terminals of port B, 36 bits of stored Dx data corresponding to the path history are provided by dual port RAM 302 on OUTB lines 330 to output decode module 310.

Figure 10:
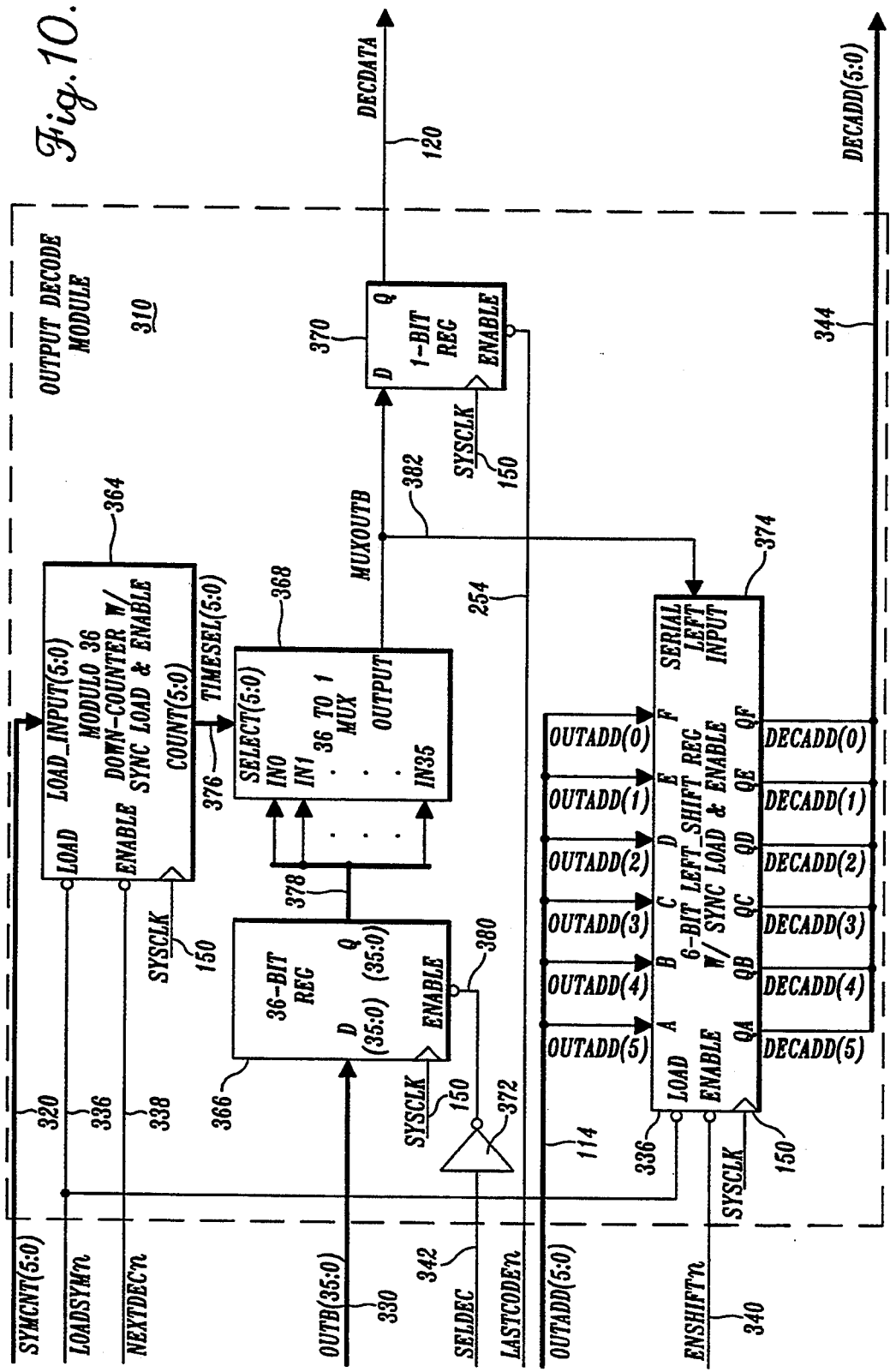
FIG. 10 is a schematic diagram of an output decode module from FIG. 8.

Output decode module 310, which is shown in FIG. 10, includes a modulo 36 down-counter 364 having a load input terminal coupled to SYMCNT lines 320 to receive the symbol count from modulo 36 down-counter (shown in FIG. 8). The output decode module also includes a 36-bit register 366, a 36:1 MUX 368, a 1-bit register 370, an inverter 372, and a 6-bit left shift register 374. LOADSYMn line 336 is connected to load terminals on modulo 36 down-counter 364 and 6-bit left shift register 374. An enable terminal on modulo 36 down-counter 364 is coupled to the signal on NEXDECn line 338. Similarly, the signal on ENSHIFTn line 340 is coupled to the enable terminal of 6-bit left shift register 374. Both modulo 36 down-counter 364 and 6-bit left shift register 374 are thus provided with synchronized load and enable signals.

The D terminals of 36-bit register 366 receive 36 bits of Dx path data (one of the 64 rows of data) stored in dual port RAM 302, the data provided being based upon the current state memory address. An enable terminal of 36-bit register 366 is connected through a line 380 to inverter 372, which inverts the signal on SEL- DEC line 342, the SELDEC signal being set high to enable the 36-bit register to pass the data at its D terminals to its Q terminals on the next system clock. The Q terminals of 36-bit register 366 are coupled through lines 378 to the 36 inputs of 36:1 MUX 368. The output of 36:1 MUX 368 is determined by a signal provided on TIMESEL lines 376 from modulo 36 down-counter 364. The signal on NEXTDECn line 338 clocks at a rate 36 times faster than the signal on LOADSYMn line 336. Initially, 36:1 MUX 368 selects the bit at its input in the column corresponding to the present symbol count (i.e. the Dx value for the current state metric address) for its output on MUXOUTB line 382. That same value is also supplied to the serial left input of 6-bit left shift register 374 and on the next system clock, the binary value applied to the serial left input is shifted left to modify the address initially loaded on OUTADD lines 114 (the address of the minimum state metric for then current state). The Dx value on MUXOUTB line 382 specifies the specific path that was followed to reach the state initially loaded into 6-bit left-shift register 336.

The shift left operation is enabled by the signal input on ENSHIFTn line 340, producing an address of the minimum path metric one step back in the path history. The system clock transfers this modified address to the DECADD lines 344 to define the address for the previous minimum path metric one symbol period ago. In response to the address on DECADD lines 344, which is applied through 2:1 MUX 296 to ADDB terminal of port B in dual port RAM 302, the 36 Dx values at that one of the 64 states is input to 36-bit register 366, enabling 36:1 MUX 368 to select one of the 36 Dx values for the previous symbol period that defines the path that was followed to reach the current minimum state metric two symbol periods ago, to be applied to the serial left input of 6-bit left shift register 374. When the signal on ENSHIFTn line 340 again enables the left shift operation, the decoded address for the next prior symbol period is output on DECADD line 344.

By repeating this operation 34 more times, the path history stored in dual port RAM 302 is traced backwards to determine the most likely data bit that was transmitted 35 symbol periods ago. That logic level, which is output on MUXOUTB line 382 is then shifted out with the next system clock in response to the signal on LASTCODEn line 254 enabling 1-bit register 370. The decoded data thus appears on DECDATA line 120. During each successive symbol period the path history is traced backwards 35 symbol periods to determine the most likely logic level that was transmitted, until the entire transmitted message is decoded.

Figure 11:
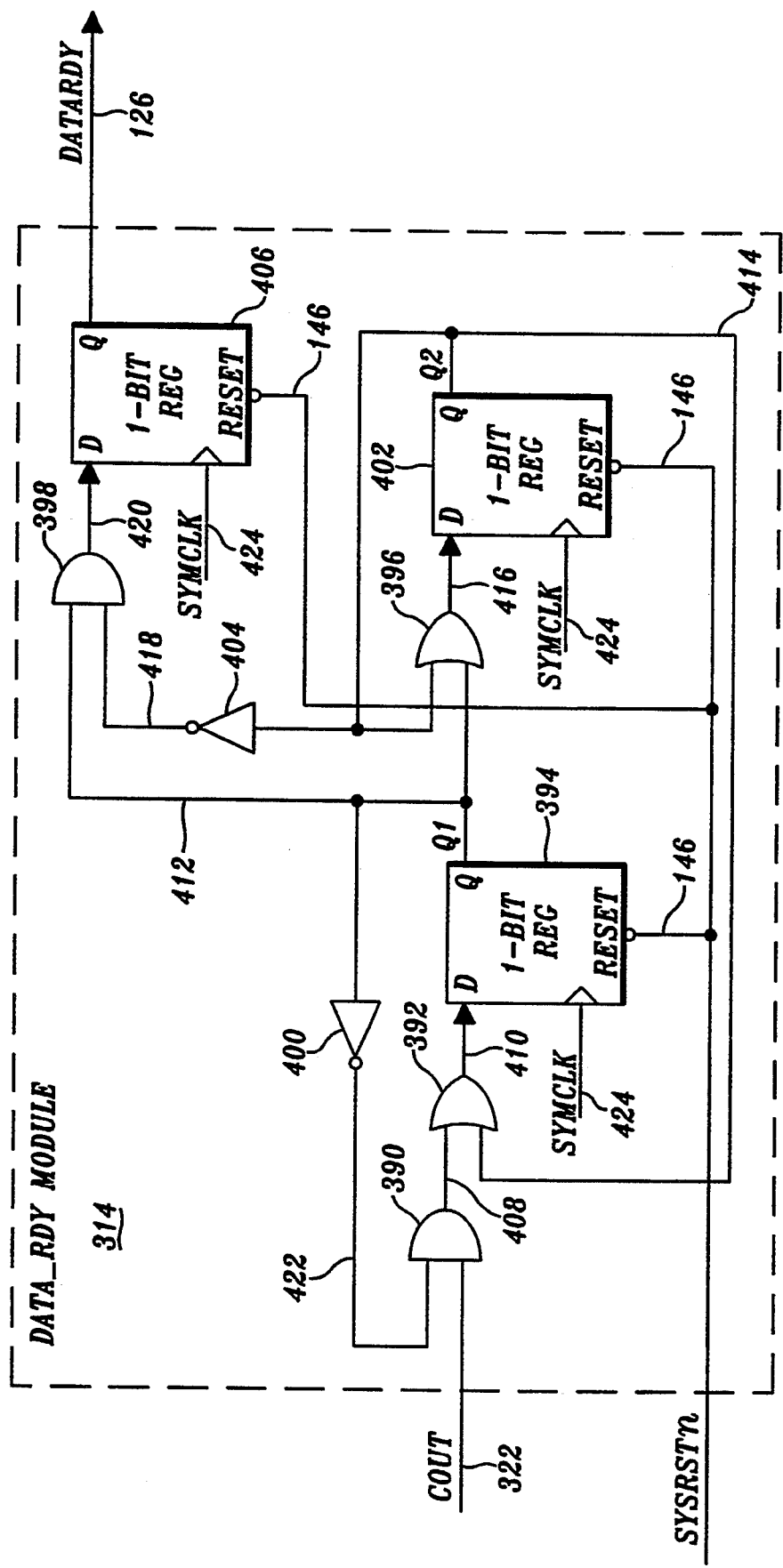
FIG. 11 is a schematic diagram of a data ready module from FIG. 8.

As shown in FIG. 11, data ready module 314 includes an AND gate 390, an OR gate 392, and a 1-bit register 394. The data ready module also includes an OR gate 396, and an AND gate 398, an inverter 400, 1-bit registers 402 and 406, and an inverter 404. The data ready module produces a signal on DATARDY line 126 that changes state after the first 36 symbols have been processed, indicating that the output data are valid. The signal on COUT line 322 is applied to one input of AND gate 390, and the output of AND gate 390 is coupled through a line 408 to one input of OR gate 392. The output of OR gate 392 is connected to the D terminal of 1-bit register 394. Initially, the $Q_1$ signal conveyed on line 412 from the Q terminal of 1-bit register 394 is a logic level 0, but this signal is inverted by inverter 400, providing a logic level 1 on a line 422, which is coupled to the second input of AND gate 390. Accordingly, when the logic level on COUT line 322 changes to a logic level 1, indicating that 36 symbol periods have elapsed following a system reset, the output of AND gate 390 changes to a logic level 1, causing the output of OR gate 392 to change from a logic level 0 to a logic level 1. The signal on $Q_1$ line 412 then changes to a logic level 1 on the next symbol clock, causing the output of OR gate 396, which is conveyed through a line 416 to the D terminal of 1-bit register 402, to change to a logic level 1.

On the next symbol clock, the output of 1-bit register 402 on $Q_2$ line 414 changes to a logic level 1 and is latched, because it is fed back to a second input of OR gate 396. The latched logic level 1 is also applied to the second input of OR gate 392, latching the $Q_1$ signal line to a logic level 1 on the next symbol clock.

The initial change in $Q_1$ signal line 412 to a logic level 1 is applied to one input of AND gate 398, the initial logic level 0 on $Q_2$ signal line 414 being inverted by inverter 404 and applied through a line 418 to the second input of the AND gate. The resulting logic level 1 that is output by AND gate 398 is conveyed by a line 420 to the D terminal of 1-bit register 406, causing its output to change to a logic level 1 at the next symbol clock. Thus, the signal on DATARDY line 126 is high (at a logic level 1) for only one symbol clock, following the change in logic level on COUT line 322 from a 0 to a 1.

Figure 12:
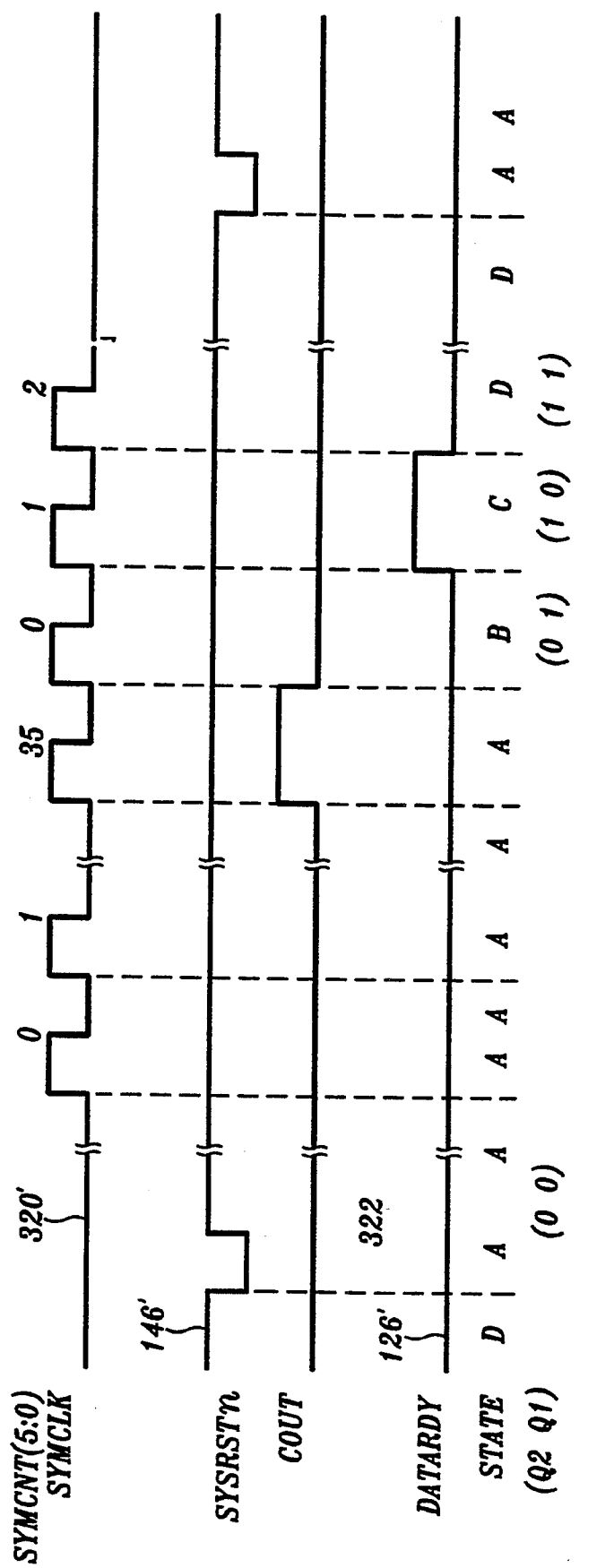
FIG. 12 is a timing signal chart for signals used by the data ready module of FIG. 11.

The relationship between the various timing signals discussed above in connection with data ready module 314 is shown in FIG. 12. The symbol clock signal and symbol count is represented by a line 320'; it is used for counting symbols from 0 through 35 as the modulo 36 up-counter (in FIG. 8) increments during each symbol period. A system reset signal is represented by a line 146' corresponding to the signal carried on SYSRSTn line 146, which is coupled to the reset terminals of 1-bit registers 394, 402, and 406. The signal on COUT line 322 is represented in FIG. 12 by a line 322'. The data ready signal is represented by a line 126' and, as indicated in the Figure, is at a logic level 1 during the second symbol period after 36 symbols have been processed. In addition, FIG. 12 shows the state of the logic levels carried on the $Q_1$ and $Q_2$ lines, which can have four possible logic level combinations represented by letters A through D, where A represents (0,0); B represents (0,1); C represents (1,0); and D represents (1,1).

Figure 13A:
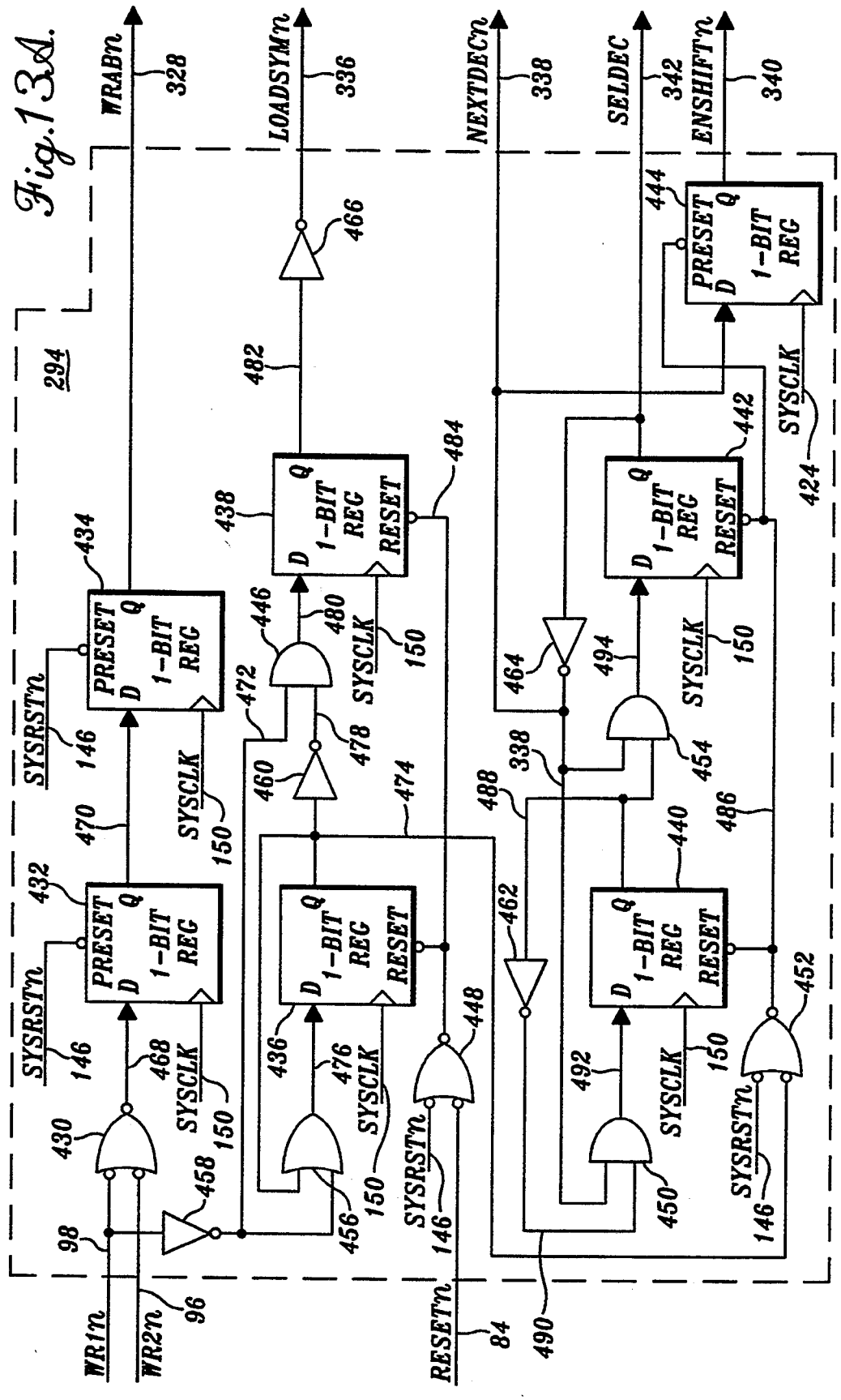
FIG. 13A is a schematic block diagram of a path memory controller that comprises one of the blocks shown in FIG. 8.
Figure 13B:
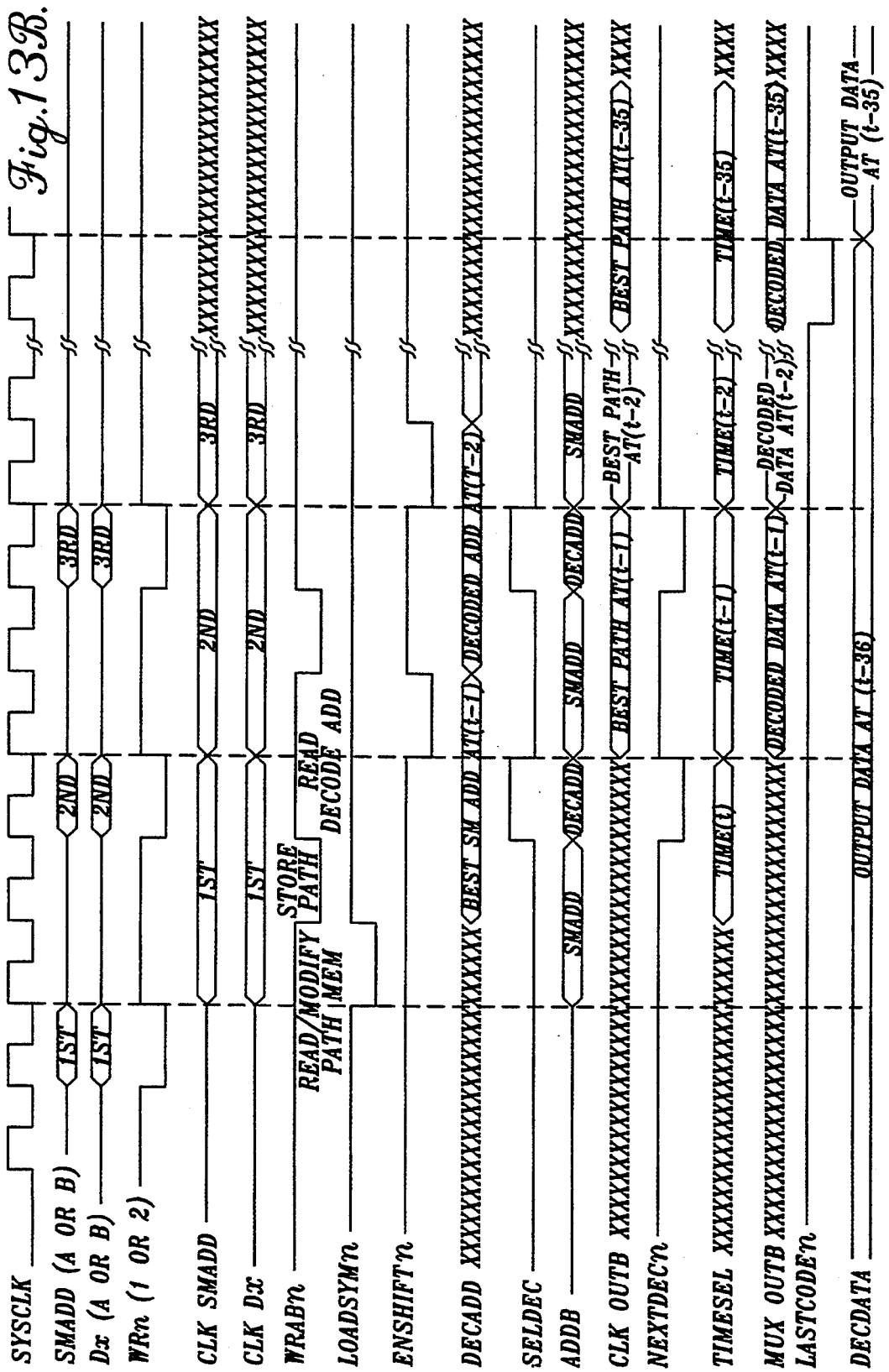
FIG. 13B is a timing signal chart for signals in the error control decoder.

Additional timing signals used in error control decoder are shown in FIG. 13B. Several of these timing signals are produced by path memory controller module 294, details of which are shown in FIG. 13A. Referring to FIG. 13A, the path memory controller module includes: NOR gates 430, 448, and 452; 1-bit registers 432, 434, 436, 438, 440, 442, and 444; and AND gates 446, 450, and 454. In addition, the path memory controller module includes an OR gate 456, and inverters 458, 460, 462, 464, and 466. The input signals to path memory controller module 294 include the write enable signals carded on WR1n line 98 and WR2n line 96, the reset signal carried on RESETn line 84, the system clock carried on SYSCLK lines 150, and the system reset signal carried on SYSRSTn line 146. The two write enable signals on WR1n line 98 and WR2n line 96 are coupled to the inputs of NOR gate 430, the output of which is conveyed through a line 468 to the D terminal of 1-bit register 432. In addition, the WR1n line is coupled to inverter 458 and the inverted write signal produced thereby is conveyed through a line 472 to one input of OR gate 456 and to one input of AND gate 446. When either write enable signal changes to a logic level 0, the output of NOR gate 430 goes low and is clocked through 1-bit register 432 at the next SYSCLK. A line 470 conveys the output of the Q terminal of 1-bit register 432 to the D terminal of 1-bit register 434. At the next SYSCLK, it produces a WRABn signal at its Q terminal, which is conveyed on a line 328. The WRABn signal is simply WR1n or WR2n (the write enable signals), delayed by two system clock cycles.

The inverted write enable signal on line 472 that is output from inverter 458 produces a logic level 1 output on OR gate 456, which is coupled to the D terminal of 1-bit register 436, when the write enable signal (non inverted) is at a logic level 0. Accordingly, this logic level 1 signal is clocked to the Q terminal of 1-bit register 436 on the next system clock and is thus fed back to the other input of OR gate 456, effectively latching 1-bit register 436 with a logic level 1 output until it is reset in response to the signals supplied on a line 484 from NOR gate 448.

The inputs to NOR gate 448 include the system reset signal conveyed on SYSRSTn line 146 and the reset signal conveyed on RESETn line 84. If either of these reset signals is at a logic level 0, 1-bit register 436 is reset. The LOADSYMn signal conveyed on a line 336 is active (logic level 0) for one clock cycle; it goes low one clock cycle after the first write enable signal, WR1n, goes low following application of a logic level 0 RESETn signal. RESETn initializes the Q terminals of 1-bit registers 436 and 438 to logic level 0. Since the Q terminal of 1-bit register 438 is coupled to inverter 466, the LOADSYMn signal on the output of the inverter is then at a logic level 1. If only WR1n (and not WR2n) is low and a reset of 1 bit register 436 occurs, the input of 1-bit register 438 is at a logic level 1, which is clocked through to its output at the next system clock. At that time, the Q terminal of the 1-bit register is at a logic level 1, causing LOADSYMn to be active at a logic level 0. At the same time, the Q terminal of 1-bit register 436 is set, placing a logic level 0 on the D terminal of 1-bit register 438 until the next RESETn. At the next system clock, the logic level 0 is clocked through 1-bit register 438, causing LOADSYMn to be high and therefore inactive for the remainder of the microcode cycle.

The output of AND gate 450 is coupled through a line 492 to the D terminal of 1-bit register 440; the Q terminal of this 1-bit register is connected through a line 488 to one input of AND gate 454 and to inverter 462. Since the initial condition of the Q terminal of 1-bit register 440 is a logic level 0, that signal is inverted to a logic level 1 and applied to one of the inputs of AND gate 450.

Further, AND gate 454 has an output coupled through a line 494 to the D terminal of 1-bit register 442, and the Q terminal of this 1-bit register is coupled to SELDEC line 342 and to inverter 464. Inverter 464 has an output coupled to both NEXDECn line 338 and to one of the inputs of AND gate 454. Since the initial input to 1-bit register 442 is a logic level 0, and its output following the first system clock after reset is inverted by inverter 464, both inputs of AND gate 454 are then at logic level 1, causing a logic level 1 output to be applied to 1-bit register 442. This signal is clocked through 1-bit register 442 with the second system clock after a reset. NEXTDECn is signal SELDEC inverted by inverter 464, and ENSHIFTn is a one clock delayed version of NEXTDECn. Initially, 1-bit registers 440 and 442 are reset by SYSRSTn, causing a logic level 0 on their Q terminals, and 1-bit register 444 is preset by SYSRSTn, causing a logic level 1 on its Q terminal. These 1-bit registers are reset at each RESETn, until the WR1n signal goes low. A line 486 conveys the output from NOR gate 452 to the reset terminals of 1-bit registers 440 and 442, and to the preset terminal of 1-bit register 444.

In the timing chart of FIG. 13B, the relationship between each of the timing signals described above is clearly illustrated over one symbol period. In this timing diagram, "X" represents an undefined condition of the signal, i.e., a "don't care" condition. Some of the signals such as ADDB and time select are not shown as logic levels, since they represent times for transferring addresses or data.

Summary of the Error Control Decoder Operation

Since the preceding description of the preferred embodiment of error control decoder 44 has been intertwined with the description of the various components comprising the error control decoder and their interconnection, it may be helpful to summarize the actual steps carried out to decode a received signal after it has been processed through orthogonal decoder 42 (shown in FIG. 1). During each symbol period, the orthogonal decoder determines correlation values for the eight possible symbols. These correlation data are provided to branch metrics module 46, which reads the eight decoded correlation values and temporarily stores them in tri-port RAM 130 (shown in FIG. 4).

Branch metrics module 46 then determines the largest of the correlation values by comparing them against each other two at a time, and retains the largest correlation value for a second pass through the values to determine the difference between the largest value and each of the correlation values. These eight differences, one of which is 0, are the branch metrics for that particular symbol period. Microcontroller 48 then selects a specific one of 64 state metrics, and computes the path metric for the state. This operation is repeated for each of the remaining 63 states.

To compute the path metrics, the two branch metrics that are associated with the two possible paths leading from previous states to the current state are each added to the state metric value for the respective previous state. To facilitate this operation, the 64 possible states are divided between states 0 through 31, and states 32 through 63, thereby doubling the speed of which the 64 path metrics are determined in a symbol period. The path metrics entering a given state are compared in add-compare-select module A 52 and add-compare-select module B 54, and the smaller path metric of the two leading to a state is assigned as a new state metric for that state. In addition, to prevent the new state metric values growing excessively large with each iteration through this process in successive symbol periods, the state metrics are normalized by selecting the minimum state metric value for the 64 possible state metrics of the previous symbol period and subtracting that minimum state metric from each of the current state metrics. This normalization ensures that 9-bits are sufficient to define the values of each of the new state metrics as the process continues.

The particular branch metric chosen to go from a previous state to the current state is associated with either a logic level 0 or 1, and this logic level is conveyed on one of DxA line 116 and DxB line 112 to path history memory module 62, where it is stored. Path history memory module 62 updates the path history for each symbol period. A path history for 36 symbol periods must be stored before a data ready signal changes logic level to indicate that the first data bit can be decoded. To determine the decoded data, the path history is traced back through the preceding 35 symbol periods, thereby identifying the most probable state that would have led through the path history to the current minimum state metric. The logic level of the Dx data bit associated with that state is the decoded data that is output. This logic level is associated with the input to the encoder (at the transmitter), which caused the transition to the new state. The path history memory module repeats this backtracking through the path history for successive symbol periods, during each symbol period tracing back through 35 stored paths of the trellis to determine the most probable decoded data. The receiver pads the path history following the last symbol period of received data so that the last symbol transmitted can be decoded to recover the data.

Each decoded data bit is reencoded and compared against the data symbol identified by the RECSYM signal to determine a symbol error rate. If noise or other effects have not caused an error in the received signal, the reencoded symbol data and the data symbol having the highest correlation value (identified by RECSYM) should be the same. If these two symbols are different, a signal is produced that is indicative of the symbol error rate for the received signal, and it provides a measure of the degradation of the channel through which the data has been transmitted, due to noise, fading, jamming, or from other causes.

While the preferred embodiment of the invention has been illustrated and described, it will be appreciated that various changes can be made therein without departing from the spirit and scope of the invention. For example, although the preferred embodiment employs an 8-ary convolutional code to encode the information bearing data, it should be apparent that the present invention is equally applicable to any M-ary convolutional code, where M is greater than two. Accordingly, it is not intended that the description of the preferred embodiment in any way limit the scope of the present invention, but that the scope of the invention instead be determined by reference to the claims that follow.

The embodiments of the invention in which an exclusive property or privilege is claimed are defined as follows:

1. A method for decoding an encoded signal that represents information bearing data comprising a plurality of bits, said information bearing data having been encoded with an orthogonal convolutional M-ary error correction code, each bit of the information bearing data being represented by one of M different symbols, where M is greater than two, said method comprising the steps of:
    (a) for each bit of the information bearing data that was encoded:
        (i) determining a correlation value for each of the M symbols;
        (ii) determining a maximum correlation value of the M correlation values of step (a) (i);
        (iii) determining M branch metrics, each branch metric comprising a difference between the maximum correlation value and one of the M correlation values;
        (iv) for each of N current states, determining a most likely path to that state as a function of the branch metrics, said branch metrics being used in connection with a state metric for a prior state to determine a new state metric for each current state; and
        (v) storing a value indicative of the most likely path from a prior state to each of the N current states, to produce a path history;
    (b) reiterating steps (a)(i) through (a)(v) for each bit of the information bearing data that was encoded; and
    (c) as a function of the path history, determining decoded data corresponding to the information bearing data that was encoded, said decoded data comprising a plurality of bits, each of which is determined by tracing back through the path history to identify a state metric value that most likely corresponds to a bit of the information bearing data.

2. A method for decoding a received signal that represents information bearing data comprising a plurality of bits, said information bearing data having been encoded with an orthogonal convolutional M-ary error correction code prior to transmission, each bit of the information bearing data being represented by one of M possible symbols, where each of the M symbols is different from the others and M is greater than two, said method comprising the steps of:
    (a) correlating the received signal to determine M correlation values, each correlation value corresponding to one of the M possible symbols;
    (b) determining a plurality of branch metrics, including a branch metric for each of the M possible symbols, the branch metric for a symbol being equal to a difference between a maximum one of the M correlation values and the correlation value corresponding to that symbol;
    (c) determining path metrics for paths entering each of N different states, by adding the branch metric corresponding to a path from a previous state to a state metric of said previous state, for each of the N different states;
    (d) comparing the path metrics entering each of the N states and selecting a minimum path metric for each state as a new state metric for that state;
    (e) identifying a data bit corresponding to the path metric selected in step (d);
    (f) updating a path history as a function of the path metric selected in step (d);
    (g) reiterating steps (a) through (f), storing the data bit for each of the N states, during each of a predetermined number of iterations, to develop a path history;
    (h) identifying a minimum state metric of the state metrics for a current iteration, to determine a most likely path through all of said iterations; and
    (i) determining a decoded output bit as a function of an earlier state by following the most likely path back through the path history for the predetermined number of iterations, said output bit corresponding to a bit of the information bearing data that was most likely encoded.

3. The method of claim 2, further comprising the step of repeating steps (a) through (i), for each successive bit of the information bearing data that were encoded, until all bits of the information bearing data that were encoded are decoded.

4. The method of claim 2, further comprising the step of identifying a symbol likely representing a bit of the information bearing data that was encoded, said symbol having the maximum correlation value of the M possible symbols.

5. The method of claim 2, wherein M has a value of eight, and wherein there are 64 possible correlation values.

6. The method of claim 2, wherein the step of selecting a minimum path metric further comprises the step of normalizing the state metrics to reduce their magnitude.

7. Apparatus for decoding an input signal encoded to represent information bearing data comprising a plurality of bits, said plurality of bits having been encoded with an orthogonal convolutional M-ary error correction code, each bit of the information bearing data being represented by one of M possible symbols, where each of the M symbols is different from the others and M is greater than two, said apparatus comprising:

(a) branch metric means for determining a branch metric for each of the M possible symbols as a function of correlation values determined from the input signal, the branch metric for a symbol being equal to a difference between a maximum one of the M correlation values and the correlation value for that symbol;

(b) adding means, coupled to the branch metric means, for determining path metrics for all paths entering a state, by adding the branch metric to a previous state metric of each path to a state, for each of N possible states;

(c) comparing means, coupled to the adding means, for comparing path metrics entering each state and including means for selecting a minimum path metric as a new state metric;

(d) updating means, coupled to the comparing means, for updating a state metric as a function of the path metric selected in (c);

(e) memory means, coupled to the updating means, for storing a path history for a predefined number of iterations of determining the branch metrics, state metrics, and path metrics, said path history identifying the path metric selected in (c) for each iteration; and (f) control means, coupled to the memory means, for identifying a minimum state metric for each iteration, to determine a most likely path through the path history and for decoding an output bit as a function of an earlier state reached by following the most likely path, said output bit most likely corresponding to a bit of the information bearing data that was encoded.

8. The apparatus of claim 7, wherein the branch metric means, adding means, comparing means, updating means, memory means, and control means comprise a single, monolithic integrated circuit.

9. The apparatus of claim 7, wherein the control means include a microcontroller.

10. The apparatus of claim 7, wherein the adding means comprise a plurality of buffers for temporarily storing a plurality of sums produced by adding state metric and selected branch metric values.

11. The apparatus of claim 7, wherein the branch metric means comprise a plurality of registers and a memory for temporarily storing the correlation values and differences between a maximum one of the M correlation values and other of the M correlation values, for each of the possible symbols.

12. The apparatus of claim 7, wherein the memory means comprise a path memory module, said path memory module including:

(a) a path memory controller;

(b) an output decode module coupled to and controlled by the path memory controller; and (c) counter means for determining when at least the predetermined number of iterations has been completed, said counter means then producing a data ready signal to indicate when the most likely path can be determined to decode a first output bit, followed by successive output bits.

13. The apparatus of claim 7, wherein the control means determine an appropriate branch metric to add to a previous state metric to reach a current state.

14. The apparatus of claim 7, further comprising means for determining an error rate of the input signal by comparing a teencoded symbol from the decoder data to a symbol determined as a function of the maximum of the correlation values derived from the input signal.

15. The apparatus of claim 7, wherein the adding means comprise normalization means for normalizing the state metrics.

16. In a communication system that encodes binary data to be transmitted using an orthogonal convolutional M-ary error correction code to represent the binary data with M different symbols, M being greater than two, a method for decoding a received signal to recover the binary data that was transmitted, even when the received signal has been affected by noise, said method comprising the steps of:

(a) for each bit of the binary data that was encoded:

(i) processing the received signal to determine one of N possible correlation values for each of the M different symbols;

(ii) determining a maximum of the correlation values determined for each of the M different symbols;

(iii) subtracting the correlation values for each of the M different symbols from the maximum of the correlation values to determine M branch metrics;

(iv) for each of two different paths leading to one of N possible current states from previous states, adding a selected one of the branch metrics to a state metric of one of the previous states to determine a path metric for each such path leading to the current state;

(v) comparing the path metrics for each of the N possible current states to determine a minimum path metric of the two paths leading to each of said current states;

(vi) assigning the minimum path metric for each of the N possible current states as a new state metric for that state; and (vii) identifying a bit value corresponding to the minimum path metric of step (a) (vi);

(b) reiterating steps (a) (i) through (a) (vii) for each bit of the binary data that was encoded for transmission;

(c) for each iteration of step (b), storing the bit value for all of the possible states, to develop a path history;

(d) identifying a minimum state metric for each iteration, to determine a most likely path through the path history;

(e) by tracing back along the most likely path, identifying an output bit associated with an earlier state metric occurring a predetermined number of iterations ago, said most likely representing a bit of the binary data that was encoded and transmitted; and (f) repeating steps (a) through (e) for each successive bit of the binary data that was encoded to decode each remaining bit thereof.

17. The method of claim 16, wherein M has a value of eight, and wherein there are 64 possible states for each iteration and 64 possible different correlation values.

18. The method of claim 16, further comprising the step of normalizing the state metric for each possible state to reduce a magnitude of the state metric.

19. The method of claim 16, wherein the step of identifying the output bit comprises the step of backing through the path history, following paths connected to the minimum state metric of the current states, to reach the earlier state metric that occurred the predetermined number of iterations ago.

20. The method of claim 16, wherein the maximum of the correlation values corresponds to one of the eight possible symbols that was likely transmitted if the received signal was not adversely affected by noise.

21. The method of claim 16, further comprising the step of determining an error rate for the received signal.

* * * * *

UNITED STATES PATENT AND TRADEMARK OFFICE
CERTIFICATE OF CORRECTION

PATENT NO. : 5,390,198
DATED : February 14, 1995
INVENTOR(S) : R.P. Higgins

It is certified that error appears in the above-indentified patent and that said Letters Patent is hereby corrected as shown below:

| COLUMN | LINE | |
|---|---|---|
| 18 | 59 | "carded" should read --carried-- |
| 24 (Claim 14, | 18 line 3) | "teencoded" should read --reencoded-- |

Signed and Sealed this

Thirtieth Day of May, 1995

Attest:

BRUCE LEHMAN

*Attesting Officer*         *Commissioner of Patents and Trademarks*